(12) United States Patent
Park

(10) Patent No.: US 9,384,802 B2
(45) Date of Patent: Jul. 5, 2016

(54) BIT LINE SENSING METHODS OF MEMORY DEVICES

(71) Applicant: Samsung Electronics Co., Ltd., Suwon-si (KR)

(72) Inventor: Sung-chul Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/557,788

(22) Filed: Dec. 2, 2014

(65) Prior Publication Data

US 2015/0155015 A1  Jun. 4, 2015

(30) Foreign Application Priority Data

Dec. 2, 2013  (KR) ................. 10-2013-0148472

(51) Int. Cl.
*G11C 7/06* (2006.01)
*G11C 7/12* (2006.01)
*G11C 11/4091* (2006.01)
*G11C 11/4094* (2006.01)

(52) U.S. Cl.
CPC *G11C 7/12* (2013.01); *G11C 7/062* (2013.01); *G11C 7/065* (2013.01); *G11C 11/4091* (2013.01); *G11C 11/4094* (2013.01)

(58) Field of Classification Search
CPC ........................................ G11C 7/065
USPC .......................................... 365/205
See application file for complete search history.

(56) References Cited

U.S. PATENT DOCUMENTS

| 4,733,373 | A | * | 3/1988 | Murotani | ........... | G11C 11/4094 |
|---|---|---|---|---|---|---|
| | | | | | | 365/203 |
| 6,535,025 | B2 | | 3/2003 | Terzioglu et al. | | |
| 6,594,187 | B2 | | 7/2003 | Ito | | |
| 6,996,013 | B2 | * | 2/2006 | Itaka | ........... | G11C 7/065 |
| | | | | | | 257/E27.112 |
| 7,113,004 | B2 | | 9/2006 | Terzioglu et al. | | |
| 7,443,750 | B2 | * | 10/2008 | Forbes | ........... | G11C 11/4091 |
| | | | | | | 365/149 |

(Continued)

FOREIGN PATENT DOCUMENTS

| JP | 10-055672 | 2/1998 |
|---|---|---|
| JP | 2001-076491 | 3/2001 |

(Continued)

OTHER PUBLICATIONS

Moon et al. "Sense Amplifier with Offset Mismatch Calibration for Sub 1-V DRAM Core Operation" IEEE, pp. 3501-3504, 2010.

*Primary Examiner* — Son Mai
(74) *Attorney, Agent, or Firm* — Myers Bigel & Sibley, P.A.

(57) ABSTRACT

Bit line sensing methods may be provided. The methods may include pre-charging a first bit line and a second bit line with a bit line pre-charge voltage. The first bit line may be connected to a first input terminal of a first inverter, and the second bit line may be connected to a second input terminal of a second inverter. The method may also include adjusting voltages of the first bit line and the second bit line corresponding to either threshold voltages of first and second pull-down circuits included in the first and second inverters respectively or threshold voltages of first and second pull-up circuits included in the first and second inverters respectively. The method may further include sharing charges of one of the first bit line and the second bit line with charges of a corresponding memory cell and amplifying a voltage difference between the first bit line and the second bit line.

20 Claims, 15 Drawing Sheets

(56) References Cited

U.S. PATENT DOCUMENTS 7,995,405 B2 8/2011 Akiyama et al.
2011/0255359 A1 10/2011 Sachdev et al.

FOREIGN PATENT DOCUMENTS

JP 2010-146689 7/2010
KR 1020100100132 9/2010

\* cited by examiner

BIT LINE SENSING METHODS OF MEMORY DEVICES

CROSS-REFERENCE TO RELATED APPLICATIONS

This U.S. non-provisional application claims priority under 35 U.S.C. §119 to Korean Patent Application No. 10-2013-0148472, filed on Dec. 2, 2013, in the Korean Intellectual Property Office, the disclosure of which is hereby incorporated by reference herein in its entirety.

BACKGROUND

The present inventive concept generally relates to the field of electronics and, more particularly, to memory devices.

Memory devices having a high density, a low power consumption and a high operation speed have been developed. High density memory devices may include fine patterns and those fine patterns may cause a loading mismatch between a bit line and a complementary bit line connected to a bit line sense amplifier or a threshold voltage mismatch between transistors in the bit line sense amplifier. These mismatches may decrease sensing efficiency of a bit line sense amplifier by reducing, for example, a sensing margin or a sensing speed.

SUMMARY

A bit line sensing method may include pre-charging a first bit line and a second bit line with a bit line pre-charge voltage. The first bit line may be connected to a first input terminal of a first inverter, and the second bit line may be connected to a second input terminal of a second inverter. The method may also include adjusting voltages of the first bit line and the second bit line corresponding to either threshold voltages of first and second pull-down circuits included in the first and second inverters respectively or threshold voltages of first and second pull-up circuits included in the first and second inverters respectively. Further the method may include sharing charges of one of the first bit line and the second bit line with charges of a corresponding memory cell and amplifying a voltage difference between the first bit line and the second bit line.

According to various embodiments, the adjusting the voltages of the first bit line and the second bit line may include connecting a first output terminal of the first inverter to the first input terminal and a second output terminal of the second inverter to the second input terminal and selectively operating either the first and second pull-down circuits or the first and second pull-up circuits.

In various embodiments, each of the first and second pull-down circuits may include an N-channel metal oxide semiconductor (NMOS) transistor, and each of the first and second pull-up circuits may include a P-channel metal oxide semiconductor (PMOS) transistor.

In various embodiments, the selectively operating either the first and second pull-down circuits or the first and second pull-up circuits may include operating the first and second pull-down circuits when the NMOS transistor has a size that is substantially the same as a size of the PMOS transistor.

According to various embodiments, the selectively operating either the first and second pull-down circuits or the first and second pull-up circuits may include applying a driving voltage to either the first and second pull-down circuits or the first and second pull-up circuits.

According to various embodiments, the adjusting the voltages of the first bit line and the second bit line may include turning on a first switch that is connected between the first input terminal and a first output terminal of the first inverter and a second switch that is connected between the second input terminal and a second output terminal of the second inverter responsive to a first control signal. The sharing the charges of the one of the first bit line and the second bit line with the charges of the corresponding memory cell and the amplifying the voltage difference between the first bit line and the second bit line may include turning off the first and second switches.

In various embodiments, the sharing the charges of the one of the first bit line and the second bit line with the charges of the corresponding memory cell and the amplifying the voltage difference between the first bit line and the second bit line may include turning on a third switch that is connected between the first output terminal and the second bit line and a fourth switch that is connected between the second output terminal and the first bit line.

According to various embodiments, the first and second switches may operate exclusively with respect to the third and fourth switches.

In various embodiments, the sharing the charges of the one of the first bit line and the second bit line with the charges of the corresponding memory cell may include turning on the third switch responsive to a second control signal changing from a first state to a second state at a first time. The second state may be different from the first state. The amplifying the voltage difference between the first bit line and the second bit line may include turning on the fourth switch responsive to a third control signal changing from the first state to the second state at a second time that may be different from the first time.

A bit line sensing method may include pre-charging a first bit line and a second bit line with a bit line pre-charge voltage. The first bit line and the second bit line may be connected to a first inverter and a second inverter. The first inverter and the second inverter may be reversely connected between the first bit line and the second bit line. The method may also include adjusting one of voltages of the first and second bit lines corresponding to one of threshold voltages of the first and second inverters and sharing charges of one of the first and second bit lines with charges of a corresponding memory cell. The method may further include amplifying a voltage difference between the first bit line and the second bit line. One of the voltages of the first and second bit lines may be amplified in multiple operations.

According to various embodiments, the amplifying the voltage difference between the first bit line and the second bit line may include inverting the voltage of one of the first and second bit lines by operating one of the first and second inverters and amplifying the voltage difference between the first and second bit lines by operating the first and second inverters.

In various embodiments, the inverting the voltage of the one of the first and second bit lines may include inverting the voltage of the first bit line by operating the first inverter when the charges of the first bit line are shared with the charges of the corresponding memory cell and inverting the voltage of the second bit line by operating the second inverter when the charges of the second bit line are shared with the charges of the corresponding memory cell.

According to various embodiments, the amplifying the voltage difference between the first bit line and the second bit line may include turning on a first output switch that is connected between a first output terminal of the first inverter and the second bit line responsive to a first output control signal changing from a first state to a second state that may be different from the first state before applying driving voltages to the first and second inverters. The amplifying the voltage difference between the first bit line and the second bit line may also include turning on a second output switch that is connected between a second output terminal of the second inverter and the first bit line responsive to a second output control signal changing from the first state to the second state after applying the driving voltages to the first and second inverters.

In various embodiments, the adjusting the one of the voltages of the first and second bit lines may include connecting a first input terminal of the first inverter to a first output terminal of the first inverter by turning on a first input switch that is connected between the first input terminal and the first output terminal and a second input terminal of the second inverter to a second output terminal of the second inverter by turning on a second input switch that is connected between the second input terminal and the second output terminal responsive to an offset control signal. The adjusting the one of the voltages of the first and second bit lines may also include applying a driving voltage to the first and second inverters after the connecting the first input terminal to the first output terminal and the second input terminal to the second output terminal.

According to various embodiments, the corresponding memory cell may be a dynamic random access memory (DRAM) cell.

A bit line sensing method may include charging a first bit line and a second bit line with a pre-charge voltage. The first bit line may be connected to a first input terminal of a first inverter, and the second bit line may be connected to a second input terminal of a second inverter. The method may also include connecting a first output terminal of the first inverter to the first input terminal and a second output terminal of the second inverter to the second input terminal, operating either first and second pull-up circuits of the first and second inverters respectively or first and second pull-down circuits of the first and second inverters respectively, connecting the first output terminal to the second bit line at a first time, connecting the second output terminal to the first bit line at a second time, sharing charges of one of the first bit line and the second bit line with charges of a memory cell at third time and applying a first driving voltage to the first inverter and a second driving voltage to the second inverter at a fourth time.

According to various embodiments, the operating either the first and second pull-up circuits of the first and second inverters respectively or the first and second pull-down circuits of the first and second inverters respectively may include operating the first and second pull-up circuits exclusively with respect to the first and second pull-down circuits.

According to various embodiments, the second time may be after the first time.

In various embodiments, the fourth time may be between the first time and the second time.

According to various embodiments, the first time may be substantially equal to the second time, and the fourth time may be after the third time.

DETAILED DESCRIPTION

Figure 1:
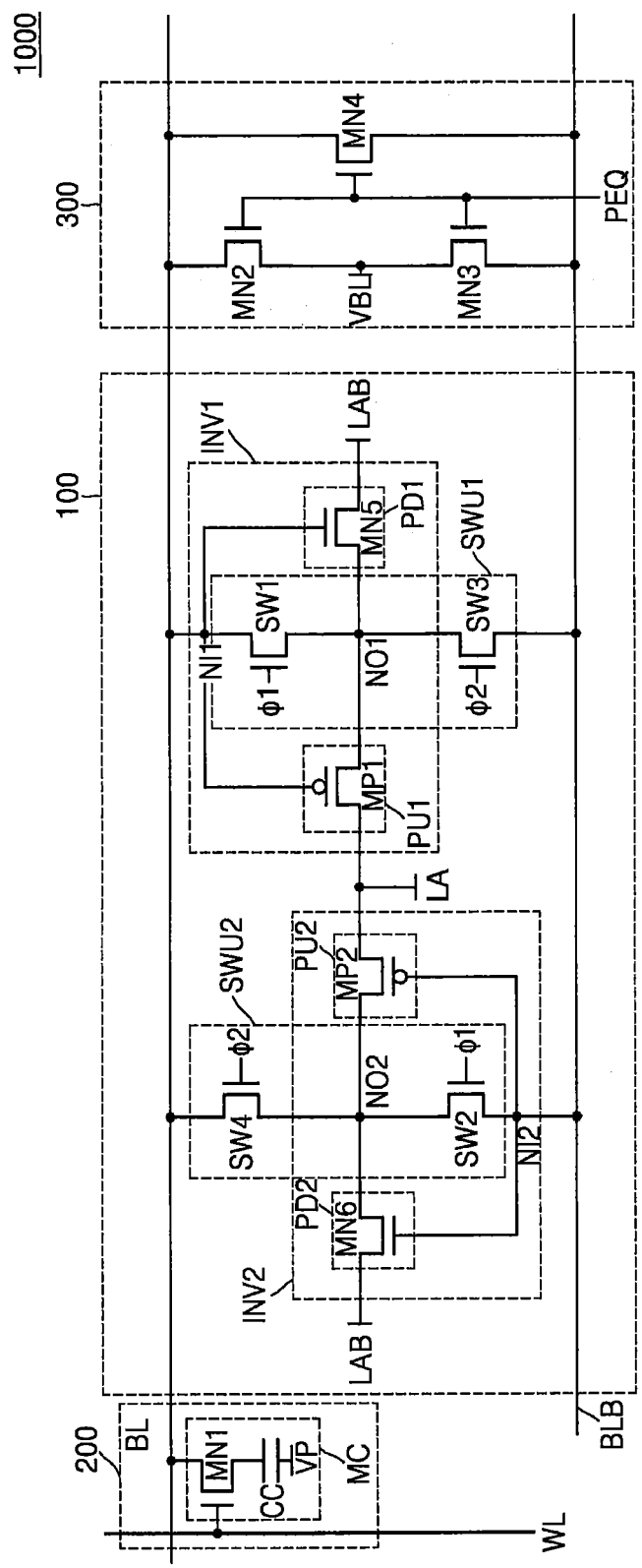
FIG. 1 is a circuit diagram illustrating a memory device including a bit line sense amplifier according to some embodiments of the present inventive concept.

Example embodiments of the present inventive concept will now be described with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity.

The terminology used in the application is for the purpose of describing particular embodiments only and is not intended to be limiting the present inventive concept. As used herein, the singular forms "a," "an," and "the" are intended to include the plural forms as well, unless the context clearly indicates otherwise. It will be further understood that the terms "comprises," "comprising," "includes" and/or "including", when used in this specification, specify the presence of stated features, steps, operations, elements and/or components, but do not preclude the presence or addition of one or more other features, steps, operations, elements, components and/or groups thereof.

Unless otherwise defined, all terms including technical or scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, expressions, such as "at least one of," preceding a list of elements modify the entire list of elements and do not modify the individual elements of the list.

It will be understood that when an element is referred to as being "coupled," "connected," or "responsive" to another element, it can be directly coupled, connected, or responsive to the other element, or intervening elements may also be present. In contrast, when an element is referred to as being "directly coupled," "directly connected" or "directly responsive" to another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added or inserted between the blocks that are illustrated, and/or blocks/operations may be omitted without departing from the scope of the present inventive concept.

Figure 2A:
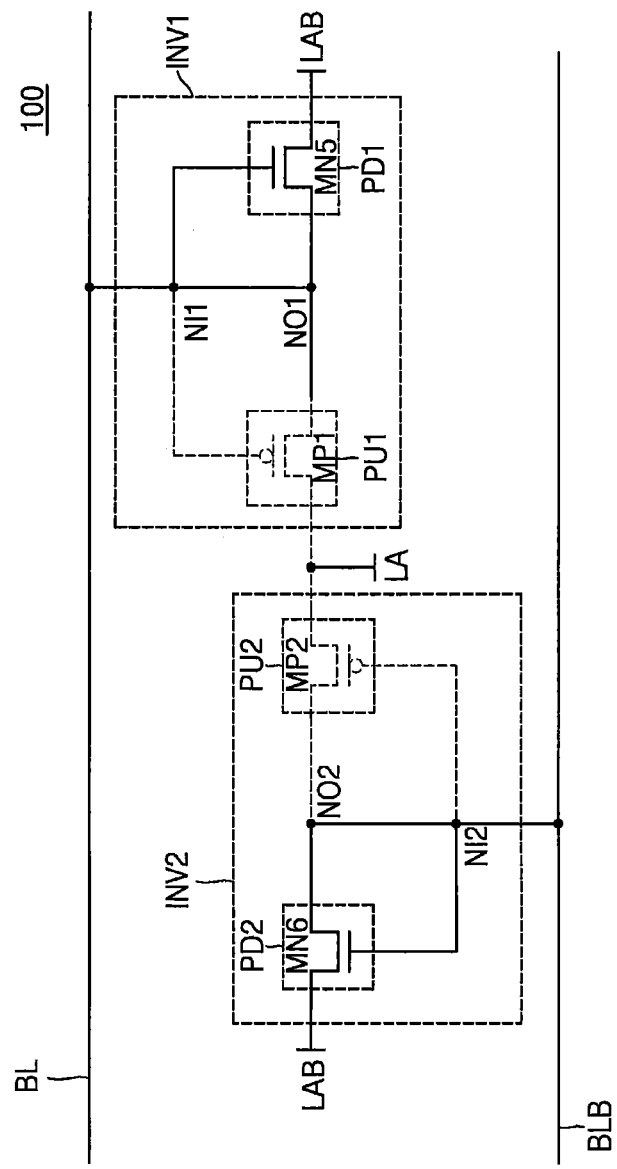
FIGS. 2A and 2B are circuit diagrams illustrating an operation of a bit line sense amplifier according to some embodiments of the present inventive concept.
Figure 2B:
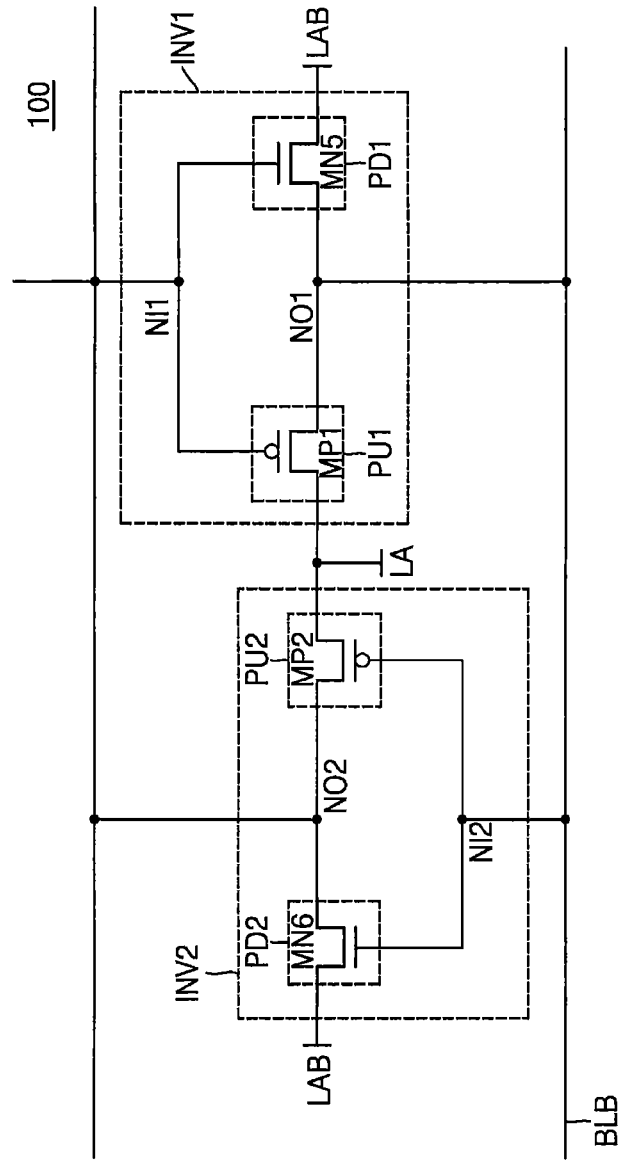

FIG. 1 is a circuit diagram illustrating a memory device including a bit line sense amplifier according to some embodiments of the present inventive concept. FIGS. 2A and 2B are circuit diagrams illustrating an operation of a bit line sense amplifier according to some embodiments of the present inventive concept.

Referring to FIG. 1, a memory device 1000 may include a bit line sense amplifier 100, a memory cell array block 200, and an equalizer 300. The memory cell array block 200 may include a plurality of memory cells MCs connected between a plurality of bit lines BLs and a plurality of word lines WLs. FIG. 1 shows only one memory cell MC for convenience of description.

The memory cell MC may be connected to a first bit line BL and a word line WL and may include a first transistor MN1 and a cell capacitor CC that are connected in series to each other. A cell plate voltage VP may be applied to one end of the cell capacitor CC. A word line signal may be applied to a gate of the first transistor MN1 through the word line WL. According to some embodiments of the present inventive concept, the memory cell MC may be further connected to a second bit line BLB.

The equalizer 300 may be connected between the first bit line BL and the second bit line BLB. The equalizer 300 may pre-charge the first and second bit lines BL and BLB with a pre-charge voltage VBL responsive to a pre-charge control signal PEQ and may equalize voltage levels of the first and second bit lines BL and BLB.

The bit line sense amplifier 100 may be connected between the first bit line BL and the second bit line BLB and may amplify a difference between a voltage of the first bit line BL and a voltage of the second bit line BLB responsive to a first driving voltage and a second driving voltage. The first driving voltage may be provided through a first power supply line LA, and the second driving voltage may be provided through a second power supply line LAB. In some embodiments of the present inventive concept, the first driving voltage may be a power source voltage or an internal voltage having a constant relationship with the power source voltage, and the second driving voltage may be a ground voltage.

The bit line sense amplifier 100 may include first and second inverters INV1 and INV2 and first and second switch units SWU1 and SWU2. The first inverter INV1 may include a first pull-down unit PD1 and a first pull-up unit PU1 and may receive the voltage of the first bit line BL. The second inverter INV2 may include a second pull-down unit PD2 and a second pull-up unit PU2 and may receive the voltage of the second bit line BLB. The first and second pull-up units PU1 and PU2 of the first and second inverters INV1 and INV2 may operate responsive to the first driving voltage, and the first and second pull-down units PD1 and PD2 of the first and second inverters INV1 and INV2 may operate responsive to the second driving voltage. The first and second pull-up units PU1 and PU2 and the first and second pull-down units PD1 and PD2 may be, for example, a transistor and the like. As shown in FIG. 1, the first and second pull-up units PU1 and PU2 may be PMOS transistors MP1 and MP2, respectively, and the first and second pull-down units PD1 and PD2 may be NMOS transistors MN5 and MN6, respectively. It will be understood that a "unit" refers to a "circuit."

The first switch unit SWU1 may include a first switch SW1 and a third switch SW3 and may control an output of the first inverter INV1 by an on/off operation of the first and third switches SW1 and SW3. The output of the first inverter INV1 may be controlled by turning on or turning off the first switch SW1 and the third switch SW3. The second switch unit SWU2 may include a second switch SW2 and a fourth switch SW4 and may control an output of the second inverter INV2 by an on/off operation of the second and fourth switches SW2 and SW4. The output of the first inverter INV2 may be controlled by turning on or turning off the second switch SW2 and the fourth switch SW4. Each of the first to fourth switches SW1 to SW4 may be, for example, a transistor, a transmission gate, and the like, and in some embodiments, each of the first to fourth switches SW1 to SW4 may be an NMOS transistor as illustrated in FIG. 1. It will be understood that turning "on" a switch refers to conductively coupling two terminals of the switch together such that a current can flow from one terminal through the switch to the other terminal, and turning "off" a switch refers to creating an open circuit between the two terminals of the switch such that the terminals are disconnected from each other and a current cannot flow through the switch.

The first and second switches SW1 and SW2 may be turned on/off responsive to a first control signal Φ1. When the first control signal Φ1 is enabled, e.g., having a logic "HIGH" state, the first and second switches SW1 and SW2 may be turned on to thereby connect an input terminal NI1 and an output terminal NO1 of the first inverter INV1 and connect an input terminal NI2 and an output terminal NO2 of the second inverter INV2.

The third and fourth switches SW3 and SW4 are turned on/off responsive to a second control signal Φ2. When the second control signal Φ2 is enabled, e.g., having a logic "HIGH" state, the third and fourth switches SW3 and SW4 may be turned on to thereby connect the output terminal NO1 of the first inverter INV1 to the second bit line BLB and connect the output terminal NO2 of the second inverter INV2 to the first bit line BL.

A pair including the first and second switches SW1 and SW2 may operate exclusively with respect to a pair including the third and fourth switches SW3 and SW4, and to this end, the first control signal Φ1 and the second control signal Φ2 may be reversed to each other. Stated in other words, the first control signal Φ1 may have a state different from a state of the second control signal Φ2, and the first and second switches SW1 and SW2 may thus operate exclusively with respect to the third and fourth switches SW3 and SW4.

The bit line sense amplifier 100 according to some embodiments of the present inventive concept may pre-charge the first and second bit lines BL and BLB and may adjust voltages of the first and second bit lines BL and BLB to compensate an offset between the first and second inverters INV1 and INV2. The offset between the first and second inverters INV1 and INV2 may occur due to mismatches of threshold voltages of the transistors MP1, MP2, MN5, and MN6 in the first and second inverters INV1 and INV2. Accordingly, in some embodiments, the voltages of the first and second bit lines BL and BLB may be adjusted corresponding to threshold voltages of the first and second pull-up units PU1 and PU2 to compensate an offset between the first and second pull-up units PU1 and PU2. In some embodiments, the voltages of the first and second bit lines BL and BLB may be adjusted corresponding to threshold voltages of the first and second pull-down units PD1 and PD2 to compensate an offset between the first and second pull-down units PD1 and PD2. In other words, the voltages of the first and second bit lines BL and BLB may be adjusted corresponding to either the threshold voltages of the first and second pull-up units PU1 and PU2 or the first and second pull-down units PD1 and PD2.

FIG. 2A illustrates a circuit diagram of the bit line sense amplifier 100 of FIG. 1 when the first and second switches SW1 and SW2 are turned on. The output terminals NO1 and NO2 of the first and second inverters INV1 and INV2 may be connected to the input terminals NI1 and NI2 respectively thereof to operate the first and second pull-up units PU1 and PU2 or the first and second pull-down units PD1 and PD2. Referring to FIG. 2A, the first and second pull-down units PD1 and PD2 may operate when the second driving voltage is applied to the first and second pull-down units PD1 and PD2 through the second power supply line LAB. Since the second driving voltage may be applied only to the first and second pull-down units PD1 and PD2, only the first and second pull-down units PD1 and PD2 may operate and therefore the voltages of the first and second bit lines BL and BLB may be adjusted corresponding to only the threshold voltages of the first and second pull-down units PD1 and PD2, i.e., the NMOS transistors MN5 and MN6. The first power supply line LA of the first and second pull-up units PU1 and PU2 may be in a floating state, or the pre-charge voltage VBL may be applied to the first power supply line LA. As illustrated in FIG. 2A, the first pull-down unit PD1 may determine the voltage of the first bit line BL, and the second pull-down unit PD2 may determine the voltage of the second bit line BLB. The voltage of the first bit line BL may be adjusted corresponding to the threshold voltage of the first pull-down unit PD1, and the voltage of the second bit line BLB may be adjusted corresponding to the threshold voltage of the second pull-down unit PD2.

In some embodiments, the first driving voltage may be applied only to the first and second pull-up units PU1 and PU2 through the first power supply line LA to operate only the first and second pull-up units PU1 and PU2, thereby adjusting the voltages of the first and second bit lines BL and BLB corresponding to the threshold voltages of the first and second pull-up units PU1 and PU2, i.e., the PMOS transistors MP1 and MP2. When the first driving voltage is applied to the first and second pull-up units PU1 and PU2, the second power supply line LAB of the first and second pull-down units PD1 and PD2 may be in a floating state, or the pre-charge voltage VBL may be applied to the second power supply line LAB.

Whether the offset between the first and second pull-up units PU1 and PU2 or the offset between the first and second pull-down units PD1 and PD2 is compensated may be determined on the basis of sensing performances of the first and second pull-up units PU1 and PU2 and the first and second pull-down units PD1 and PD2 because an offset of a pair having the better sensing performance may more largely influence an operation of the bit line sense amplifier 100. For example, when sizes of the PMOS transistors MP1 and MP2 included in the first and second pull-up units PU1 and PU2 are substantially the same as the sizes of the NMOS transistors MN5 and MN6 included in the first and second pull-down units PD1 and PD2, a driving characteristic of the NMOS transistors MN5 and MN6 may be better than that of the PMOS transistors MP1 and MP2, and the sensing performance of the first and second pull-down units PD1 and PD2 may be better than that of the first and second pull-up units PU1 and PU2. Therefore, the offset between the first and second pull-down units PD1 and PD2 may be compensated.

Referring to FIG. 2B, the third and fourth switches SW3 and SW4 of the bit line sense amplifier 100 of FIG. 1 may be turned on after adjusting the voltages of the first and second bit lines BL and BLB corresponding to the threshold voltages of the first and second pull-up units PU1 and PU2 or the first and second pull-down units PD1 and PD2 as described above, and the first and second switches SW1 and SW2 may be turned off. The third and fourth switches SW3 and SW4 may be turned on to connect the output terminal NO1 of the first inverter INV1 to the second bit line BLB and to connect the output terminal NO2 of the second inverter INV2 to the first bit line BL. Accordingly, the bit line sense amplifier 100 may operate as a latch in which the first and second inverters INV1 and INV2 are connected to each other, thereby amplifying a voltage difference between the first and second bit lines BL and BLB.

Figure 3A:
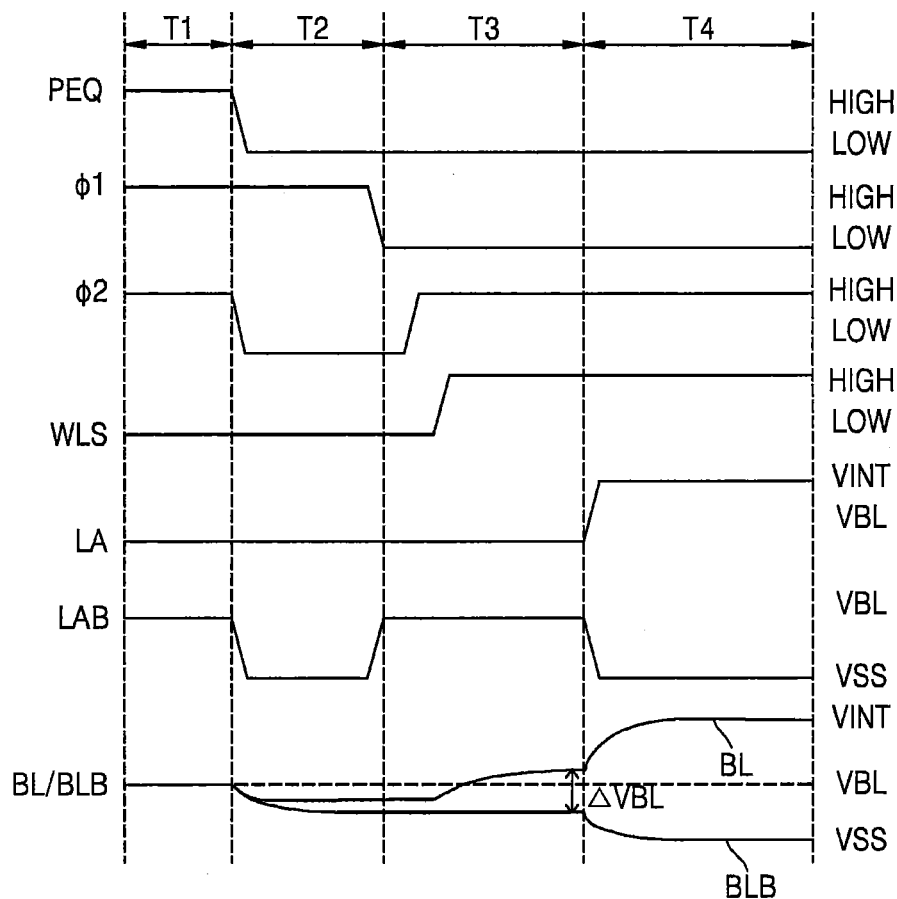
FIGS. 3A and 3B are timing diagrams illustrating an operation of a bit line sense amplifier according to some embodiments of the present inventive concept.
Figure 3B:
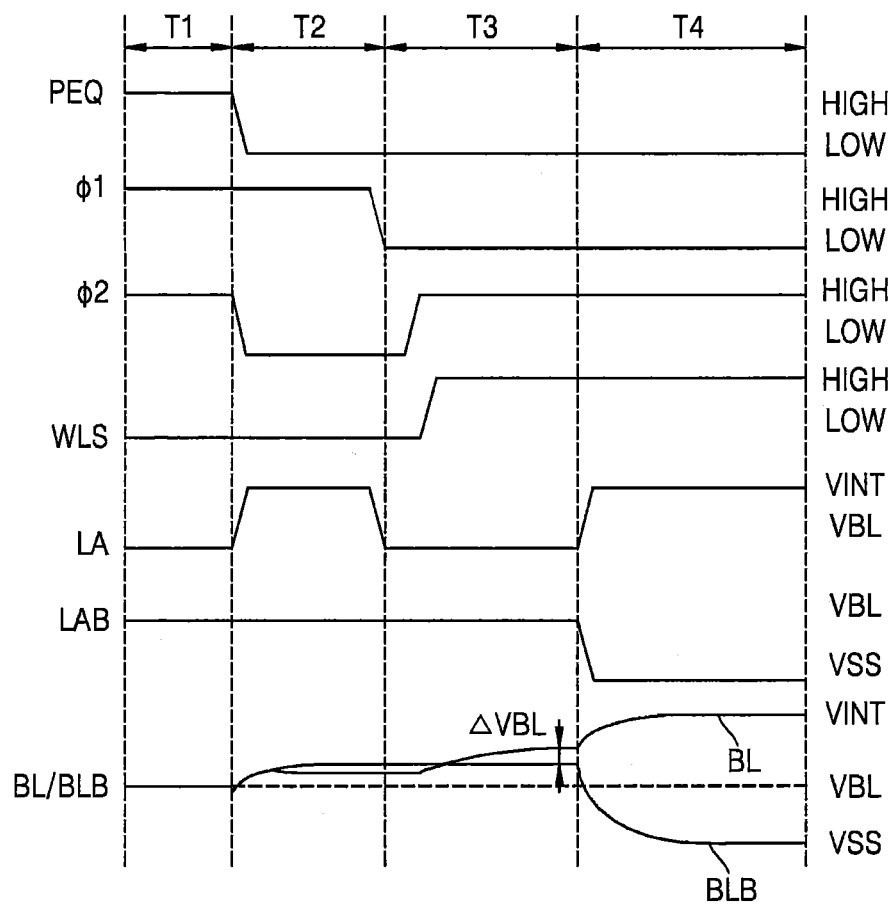

FIGS. 3A and 3B are timing diagrams illustrating an operation of a bit line sense amplifier according to some embodiments of the present inventive concept. A first duration T1 indicates a pre-charge duration, a second duration T2 indicates an offset cancellation duration, a third duration T3 indicates a charge sharing duration, and a fourth duration T4 indicates an amplification duration. The third duration T3 may include a duration of changing a connection relationship of the output terminals NO1 and NO2 of the first and second inverters INV1 and INV2 of FIG. 1 and a duration of waiting time for charge sharing. It will be understood that the first to fourth durations T1 to T4 may repeat several times according to an operation of the bit line sense amplifier 100.

FIG. 3A shows waveforms of signals in the bit line sense amplifier 100 when the voltages of the first and second bit lines BL and BLB are adjusted corresponding to the threshold voltages of the first and second pull-down units PD1 and PD2. Referring to FIGS. 1 and 3A, the pre-charge control signal PEQ provided to the equalizer 300 may be enabled in the first duration T1, thereby pre-charging the first and second bit lines BL and BLB with the pre-charge voltage VBL that is predetermined. The pre-charge control signal PEQ may be, for example, in a logic "HIGH" state. In the first duration T1, the first and second control signals Φ1 and Φ2 may also be in the logic "HIGH" state, and the pre-charge voltage VBL may be provided to the first and second power supply lines LA and LAB. After the first duration T1, the pre-charge control signal PEQ may be disabled, e.g., in a logic "LOW" state.

In the second duration T2, the first control signal Φ1 may be enabled, and the second control signal Φ2 may be disabled, thereby connecting the output terminals NO1 and NO2 of the first and second inverters INV1 and INV2 to the input terminals NI1 and NI2, respectively. The second driving voltage, e.g., the ground voltage VSS, may be provided to the second power supply line LAB, and the first power supply line LA may be floating, or the pre-charge voltage VBL may be provided to the first power supply line LA. Only the first and second pull-down units PD1 and PD2 among the first and second pull-up units PU1 and PU2 and the first and second pull-down units PD1 and PD2 of the first and second inverters INV1 and INV2 may operate, thereby adjusting the voltages of the first and second bit lines BL and BLB corresponding to the threshold voltages of the first and second pull-down units PD1 and PD2, i.e., the NMOS transistors MN5 and MN6. Accordingly, the offset between the first and second pull-down units PD1 and PD2 may be compensated.

As shown in FIG. 3A, the voltages of the first and second bit lines BL and BLB may be lower than the pre-charge voltage VBL after the second duration T2. Accordingly, in the third duration T3, an effect of a charge-sharing voltage, which is a voltage of the first bit line BL after charge sharing between the first bit line BL and the memory cell MC, may further increase when a data value of the memory cell MC is 1 (hereinafter, referred to as "DATA1"). Therefore, a sensing margin of DATA1 may increase, thereby reducing a possibility of occurrence of a sensing failure. It will be understood that if sensing fails more frequently for DATA1 due to data write or read compared with the case when a data value of the memory cell MC is 0 (hereinafter, referred to as "DATA0"), the possibility of occurrence of total sensing failure may be reduced by additionally lowering the voltages of the first and second bit lines BL and BLB before the charge sharing.

Still referring to FIG. 3A, in the third duration T3, the first control signal Φ1 may be disabled, and the second control signal Φ2 may be enabled. The pre-charge voltage VBL may be provided to the first and second power supply lines LA and LAB. In some embodiments, the second control signal Φ2 may be enabled after the first control signal Φ1 is disabled for a stable operation of the first and second inverters INV1 and INV2 as illustrated in FIG. 3A. In some embodiments, the first and second control signals Φ1 and Φ2 may change states concurrently. After the second control signal Φ2 is enabled, a word line signal WLS that is applied to the memory cell MC connected to the first bit line BL may be enabled. For example, the word line signal WLS may change from a logic "LOW" level to a logic "HIGH" level. When a data value of the memory cell MC is 1, the voltage of the first bit line BL may increase according to the charge sharing, and the first and second bit lines BL and BLB may have a voltage difference of ΔVBL. If the data value of the memory cell MC is 0, the voltage of the first bit line BL may decrease, and the first and second bit lines BL and BLB may have a voltage difference. Although FIG. 3A shows that the word line signal WLS is enabled after the second control signal Φ2 is enabled, embodiments of the present inventive concept are not limited thereto. The word line signal WLS may be enabled at the substantially same time as or before the second control signal Φ2 is enabled.

In the fourth duration T4, the first driving voltage VINT may be supplied to the first power supply line LA, and the second driving voltage, e.g., the ground voltage VSS, may be supplied to the second power supply line LAB. The voltage difference between the first and second bit lines BL and BLB ΔVBL may be amplified to a difference between the first driving voltage VINT and the second driving voltage, VINT minus VSS.

FIG. 3B shows waveforms of signals in the bit line sense amplifier 100 when the voltages of the first and second bit lines BL and BLB are adjusted corresponding to the threshold voltages of the first and second pull-up units PU1 and PU2. FIG. 3B is similar to FIG. 3A, FIG. 3B however differs from FIG. 3A with respect to an operation in the second duration T2. Referring to FIG. 3B, in the second duration T2, the first driving voltage VINT is provided to the first power supply line LA, and the second power supply line LAB is floating, or the pre-charge voltage VBL is provided to the second power supply line LAB. Only the first and second pull-up units PU1 and PU2 among the first and second pull-up units PU1 and PU2 and the first and second pull-down units PD1 and PD2 of the first and second inverters INV1 and INV2 may operate, thereby adjusting the voltages of the first and second bit lines BL and BLB corresponding to the threshold voltages of the first and second pull-up units PU1 and PU2, i.e., the PMOS transistors MP1 and MP2. Accordingly, the offset between the first and second pull-up units PU1 and PU2 may be compensated. The threshold voltages of the first and second pull-up units PU1 and PU2 may be higher than the pre-charge voltage VBL, and the voltages of the first and second bit lines BL and BLB may thus be higher than the pre-charge voltage VBL.

Figure 4:
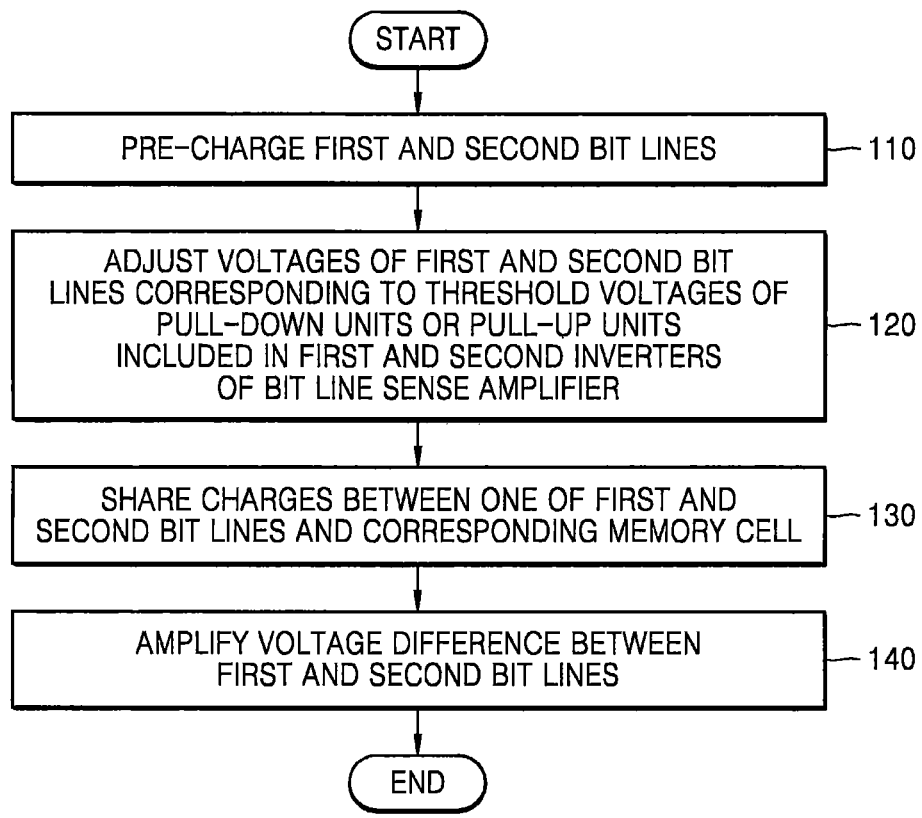
FIGS. 4 and 5 are flowcharts of a bit line sensing method according to some embodiments of the present inventive concept.
Figure 5:
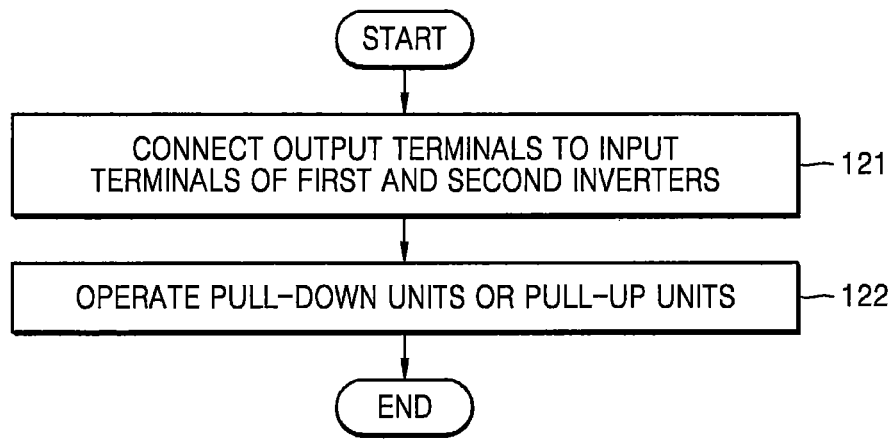

FIGS. 4 and 5 are flowcharts of a bit line sensing method according to some embodiments of the present inventive concept.

Referring to FIG. 4, a bit line sensing method according to some embodiments may include pre-charging first and second bit lines with a predetermined bit line pre-charge voltage (Block 110) and adjusting voltages of the first and second bit lines corresponding to threshold voltages of pull-down units or pull-up units included in first and second inverters (Block 120).

Referring to FIG. 5, the adjusting the voltages of the first and second bit lines may include connecting output terminals of the first and second inverters to respective input terminals of the first and second inverters (Block 121) and operating the pull-down units or the pull-up units (Block 122). The pull-down units may operate exclusively with respect to the pull-up units. When an offset between the pull-down units is compensated, a second driving voltage may be applied to a second power supply line connected to the pull-down units, and a first power supply line connected to the pull-up units may be floating, or a pre-charge voltage may be applied to the first power supply line. Accordingly, only the pull-down units may operate. When an offset between the pull-up units is compensated, a first driving voltage may be applied to the first power supply line connected to the pull-up units, and the second power supply line connected to the pull-down units may be floating, or the pre-charge voltage may be applied to the second power supply line. Accordingly, only the pull-up units may operate. Accordingly, the voltages of the first and second bit lines may be adjusted corresponding to the threshold voltages of the pull-up units in the first and second inverters.

Referring again to FIG. 4, the method may also include sharing charges of one of the first and second bit lines with charges of a corresponding memory cell (Block 130). Accordingly, there may be a voltage difference between the first and second bit lines. The voltage difference between the first and second bit lines may be detectable. Thereafter, the voltage difference between the first and second bit lines may be amplified (Block 140). The voltage difference between the first and second bit lines may be amplified corresponding to the first and second driving voltages applied to the first and second inverters. For example, when the voltage of the first bit line is higher than the voltage of the second bit line, the voltage of the first bit line may be amplified up to a level of the first driving voltage, and the voltage of the second bit line may be amplified up to a level of the second driving voltage.

Figure 6:
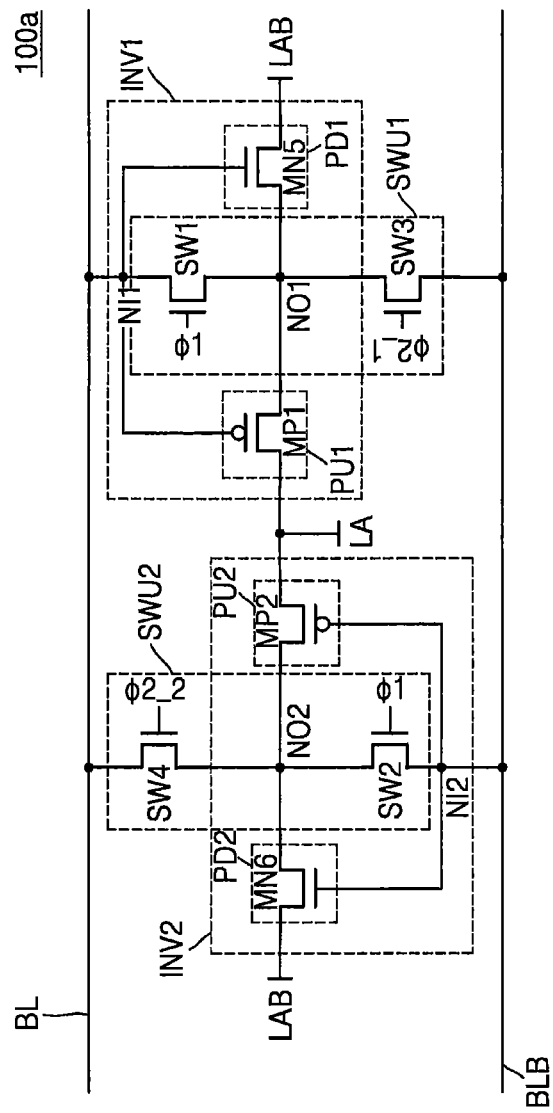
FIG. 6 is a circuit diagram illustrating a bit line sense amplifier according to some embodiments of the present inventive concept.

FIG. 6 is a circuit diagram illustrating a bit line sense amplifier according to some embodiments of the present inventive concept.

Referring to FIG. 6, a bit line sense amplifier 100a may include first and second inverters INV1 and INV2 and first and second switch units SWU1 and SWU2. The first inverter INV1 may include a first pull-down unit PD1 and a first pull-up unit PU1 and may receive a voltage of a first bit line BL. The second inverter INV2 may include a second pull-down unit PD2 and a second pull-up unit PU2 and may receive a voltage of a second bit line BLB. The first and second pull-up units PU1 and PU2 of the first and second inverters INV1 and INV2 may operate responsive to a first driving voltage, and the first and second pull-down units PD1 and PD2 of the first and second inverters INV1 and INV2 may operate responsive to a second driving voltage. In some embodiments, the first and second pull-up units PU1 and PU2 may be PMOS transistors MP1 and MP2, respectively, and the first and second pull-down units PD1 and PD2 may be NMOS transistors MN5 and MN6, respectively, as illustrated in FIG. 6.

The first switch unit SWU1 may include a first switch SW1 and a third switch SW3 and may control an output of the first inverter INV1 by an on/off operation of the first and third switches SW1 and SW3. The second switch unit SWU2 may include a second switch SW2 and a fourth switch SW4 and may control an output of the second inverter INV2 by an on/off operation of the second and fourth switches SW2 and SW4.

The first and second switches SW1 and SW2 are turned on/off responsive to a first control signal $\Phi 1$. The first control signal 431 may be referred to as an offset control signal. When the first control signal $\Phi 1$ is enabled, e.g., having a logic "HIGH" state, the first and second switches SW1 and SW2 may be turned on to thereby connect an input terminal NI1 and an output terminal NO1 of the first inverter INV1 and connect an input terminal NI2 and an output terminal NO2 of the second inverter INV2. The first driving voltage may be applied to the first and second pull-up units PU1 and PU2 to operate the first and second pull-up units PU1 and PU2 and the second driving voltage may be applied to the first and second pull-down units PD1 and PD2 to operate the first and second pull-down units PD1 and PD2. Accordingly, the voltage of the first bit line BL may be changed corresponding to a threshold voltage of the first inverter INV1, and the voltage of the second bit line BLB may be changed corresponding to a threshold voltage of the second inverter INV2. Stated in other words, each of the first inverter INV1 and the second inverter INV2 may provide a certain level of voltage corresponding to the threshold voltages of the first and second pull-up units PU1 and PU2 or the first and second pull-down units PD1 and PD2. Therefore, the threshold voltages of the first and second pull-up units PU1 and PU2 or the first and second pull-down units PD1 and PD2 are high, the first inverter INV1 and the second inverter INV2 may provide high voltages. In this case, an inverter has a certain level of voltage according to characteristics of transistors included in the inverter when input and output ends of the inverter are connected to each other, i.e., an inverter is set to a voltage value higher than threshold voltages of transistors included in the inverter when the threshold voltages are high.

As described above, an offset according to a mismatch of the first and second inverters INV1 and INV2 may be compensated by adjusting the voltages of the first and second bit lines BL and BLB corresponding to the threshold voltages of the first and second inverters INV1 and INV2.

Still referring to FIG. 6, on/off of the third switch SW3 may be controlled by a second control signal $\Phi 2\_1$, and on/off of the fourth SW4 may be controlled by a third control signal $\Phi 2\_2$. The third switch SW3 may be turned on or turned off responsive to the second control signal $\Phi 2\_1$, and the fourth switch SW4 may be turned on or turned off responsive to the third control signal $\Phi 2\_2$. The second control signal $\Phi 2\_1$ and the third control signal $\Phi 2\_2$ may be output control signals of the first and second inverters INV1 and INV2. The second control signal $\Phi 2\_1$ may control an output of the first inverter INV1, and the third control signal $\Phi 2\_2$ may control an output of the second inverter INV2. The second control signal $\Phi 2\_1$ may be enabled before the third control signal $\Phi 2\_2$ is enabled. Therefore, the first inverter INV1 may operate before the second inverter INV2 operates, the voltage of the first bit line BL, i.e., a charge-sharing voltage, may thus be inverting-amplified and may be provided to the second bit line BLB. Thereafter, the third control signal $\Phi 2\_2$ may be enabled, the second inverter INV2 may thus operate by receiving the amplified charge-sharing voltage. Since a sensing margin obtained by the charge sharing may be additionally boosted by a gain of the first inverter INV1, an additional sensing margin may be obtained.

Figure 7:
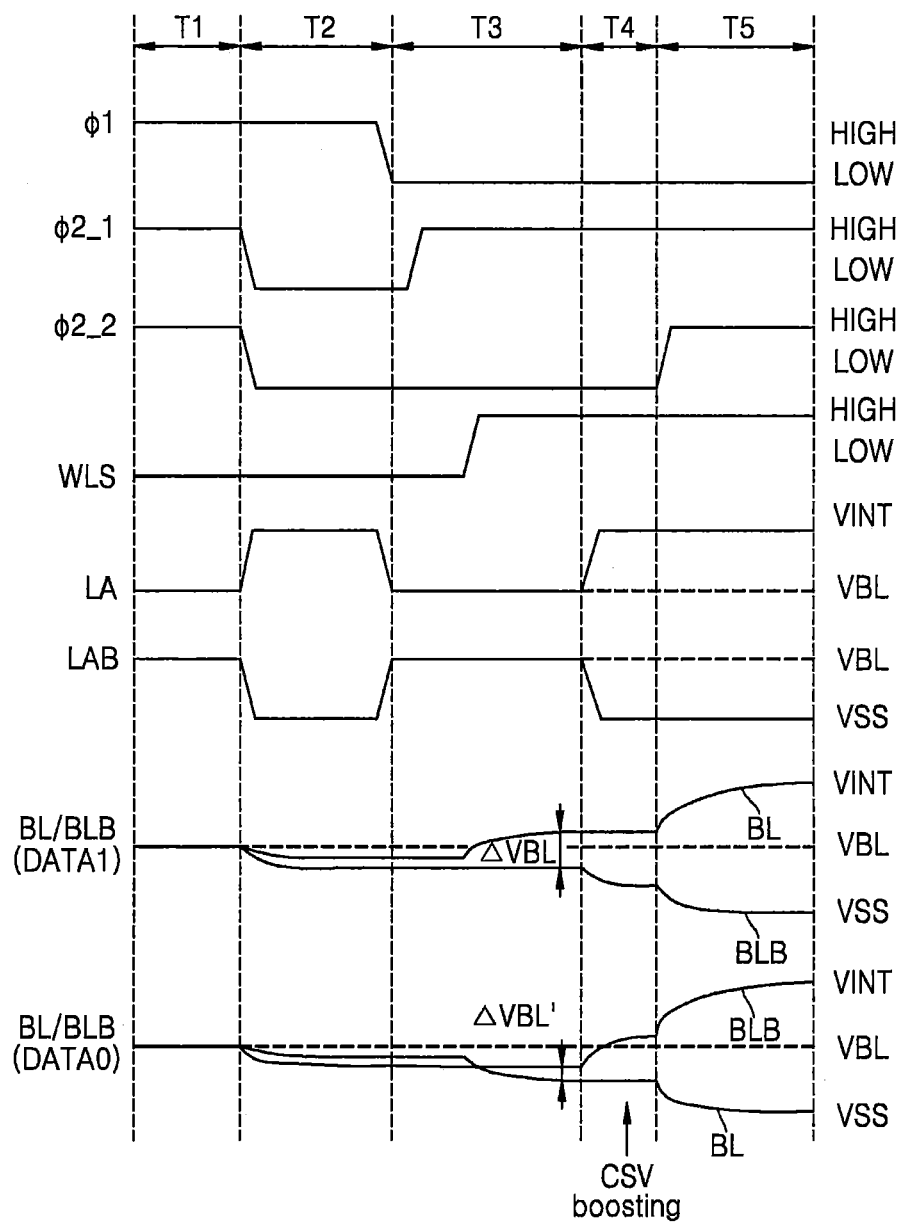
FIGS. 7 and 8 are timing diagram illustrating an operation of a bit line sense amplifier according to some embodiments of the present inventive concept.
Figure 8:
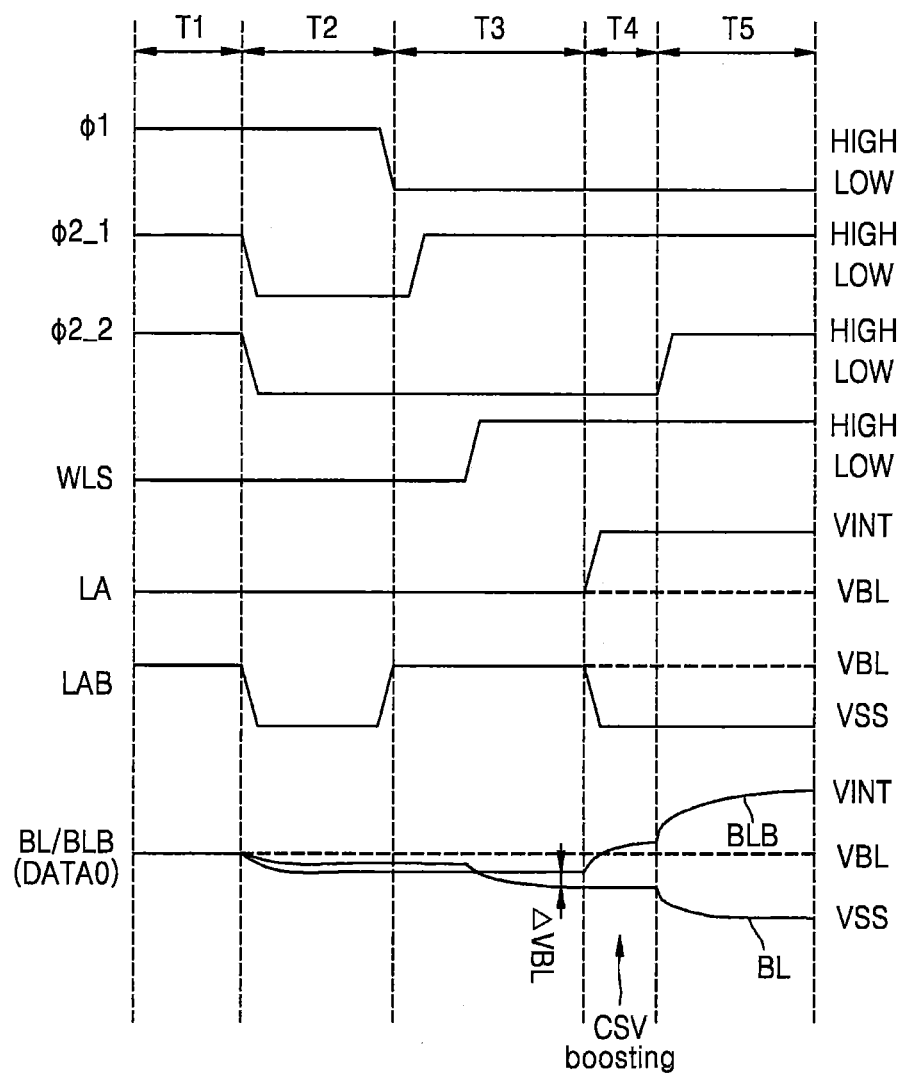

FIGS. 7 and 8 are timing diagram illustrating an operation of a bit line sense amplifier according to some embodiments of the present inventive concept.

Referring to FIG. 7, a first duration T1 indicates a pre-charge duration, a second duration T2 indicates an offset cancellation duration, a third duration T3 indicates a charge sharing duration, a fourth duration T4 indicates a charge-sharing voltage amplification duration, and a fifth duration T5 indicates an amplification duration. The first to fifth durations T1 to T5 may repeat several times according to an operation of the bit line sense amplifier 100a.

Referring to FIGS. 6 and 7, the first and second bit lines BL and BLB may be pre-charged with the pre-charge voltage VBL that is predetermined in the first duration T1. In the first duration T1, all of the first, second, and third control signals $\Phi 1$, $\Phi 2\_1$, and $\Phi 2\_2$ may be in a logic "HIGH" state, and the pre-charge voltage VBL may be provided to the first and second power supply lines LA and LAB.

In the second duration T2, the first control signal $\Phi 1$, an offset control signal, may be enabled, and the second and third control signals $\Phi 2\_1$, and $\Phi 2\_2$, output control signals, may be disabled, thereby connecting the output terminals NO1 and NO2 of the first and second inverters INV1 and INV2 to the input terminals NI1 and NI2 thereof, respectively. The second driving voltage, e.g., the ground voltage VSS, may be provided to the second power supply line LAB, and the first driving voltage VINT may be provided to the first power supply line LA. Accordingly, the voltages of the first and second bit lines BL and BLB may be adjusted corresponding to threshold voltages of the first and second inverters INV1 and INV2. For example, the voltage of the first bit line BL may be adjusted corresponding to the threshold voltage of the first inverter INV1, and the voltage of the second bit line BLB may be adjusted corresponding to the threshold voltage of the second inverter INV2. Therefore, an offset between the first and second inverters INV1 and INV2 may be compensated.

In the third duration T3, the first control signal $\Phi 1$ may be disabled, and the second control signal $\Phi 2\_1$ may be enabled. The third control signal $\Phi 2\_2$ may be maintained in the disabled state. The pre-charge voltage VBL may be provided to the first and second power supply lines LA and LAB. After the second control signal Φ2_1 is enabled, a word line signal WLS applied to the memory cell MC connected to the first bit line BL may be enabled. For example, the word line signal WLS may change from a logic "LOW" level to a logic "HIGH" level. When a data value of the memory cell MC is 1, the voltage of the first bit line BL may increase because of the charge sharing, and the first and second bit lines BL and BLB may thus have a voltage difference of ΔVBL therebetween. If the data value of the memory cell MC is 0, the voltage of the first bit line BL may decrease because of the charge sharing, and the first and second bit lines BL and BLB may thus have a voltage difference ΔVBL' therebetween. Although FIG. 7 illustrates that the word line signal WLS is enabled after the second control signal Φ2_1 is enabled, embodiments of the present inventive concept are not limited thereto. The word line signal WLS may be enabled at the substantially same time as or before the second control signal Φ2_1 is enabled.

In the fourth duration T4, the second driving voltage, e.g., the ground voltage VSS, may be supplied to the second power supply line LAB, and the first driving voltage VINT may be supplied to the first power supply line LA. Accordingly, by an inverting operation of the first inverter INV1, a charge-sharing voltage of the first bit line BL may be inverting-amplified, and the amplified voltage may be provided to the second bit line BLB. When the memory cell MC has DATA1, the charge-sharing voltage of the first bit line BL may be higher than the threshold voltage of the first inverter INV1. The charge-sharing voltage of the first bit line BL may be inverted and amplified, the voltage of the second bit line BLB may thus decrease. On the contrary, when the memory cell MC has DATA0, the charge-sharing voltage of the first bit line BL may be lower than the threshold voltage of the first inverter INV1. The charge-sharing voltage of the first bit line BL may be inverted and amplified, and the voltage of the second bit line BLB may thus increase. Since the third control signal Φ2_2 is disabled, an output of the second inverter INV2 may not be provided to the first bit line BL, and the first bit line BL may thus maintain a level of the charge-sharing voltage.

In the fifth duration T5, the third control signal Φ2_2 may be enabled, and the output of the second inverter INV2 may be provided to the first bit line BL. Accordingly, a voltage difference between the first and second bit lines BL and BLB may be amplified. Therefore, the voltage difference between the first and second bit lines BL and BLB may be amplified in two operations, in the fourth duration T4 and the fifth duration T5, and the bit line sense amplifier 100a may have a better sensing margin. As illustrated in FIG. 7, the voltage of the second bit line BLB may be amplified in multiple operations rather than in one operation.

Referring to FIG. 8, the voltages of the first and second bit lines BL and BLB may be adjusted corresponding to the threshold voltages of first and second pull-down units PD1 and PD2 when a data value of the memory cell MC is 0.

The timing diagram of FIG. 8 is similar to that of FIG. 7. However, a driving voltage corresponding to only the first and second pull-up units PU1 and PU2 or the first and second pull-down units PD1 and PD2 of the first and second inverters INV1 and INV2 may be provided in the offset cancellation duration, i.e., T2. Accordingly, the voltages of the first and second bit lines BL and BLB may be adjusted corresponding to either the threshold voltages of the first and second pull-up units PU1 and PU2 or the first and second pull-down units PD1 and PD2. According to FIG. 8, the second driving voltage VSS may be provided only to the first and second pull-down units PD1 and PD2, and the pre-charge voltage VBL may be provided to the first and second pull-up units PU1 and PU2. Therefore, the voltages of the first and second bit lines BL and BLB may be adjusted only corresponding to the threshold voltages of the first and second pull-down units PD1 and PD2.

In the fourth duration T4, only the first inverter INV1 may operates, thereby inverting-amplifying the charge-sharing voltage. In the fifth duration T5, both the first and second inverters INV1 and INV2 may operate, thereby the voltage difference between the first and second bit lines BL and BLB may be further amplified. In the fourth duration T4, since a data value of the memory cell MC is 0, the charge-sharing voltage may be lower than the threshold voltage of the first inverter INV1. The charge-sharing voltage may be inverted and amplified, and the voltage of the second bit line BLB may thus increase. In the fifth duration T5, the voltage of the first bit line BL may be amplified so as to be close to the second driving voltage VSS, and the voltage of the second bit line BLB may be amplified so as to be close to the first driving voltage VINT.

Figure 9:
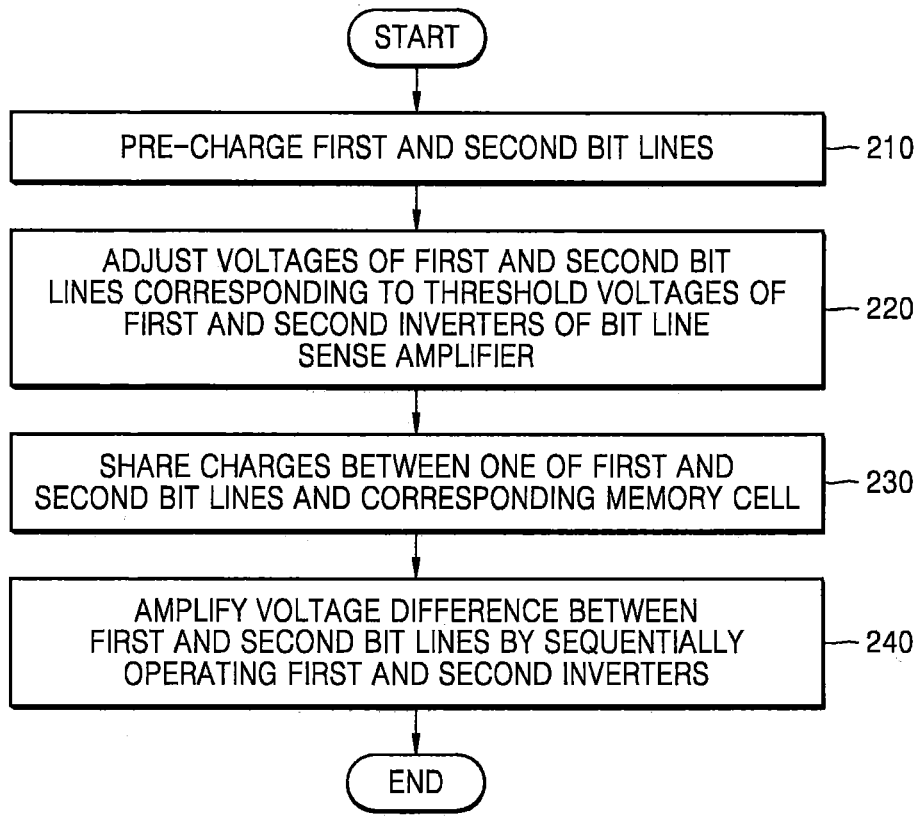
FIGS. 9 and 10 are flowcharts of a bit line sensing method according to some embodiments of the present inventive concept.
Figure 10:
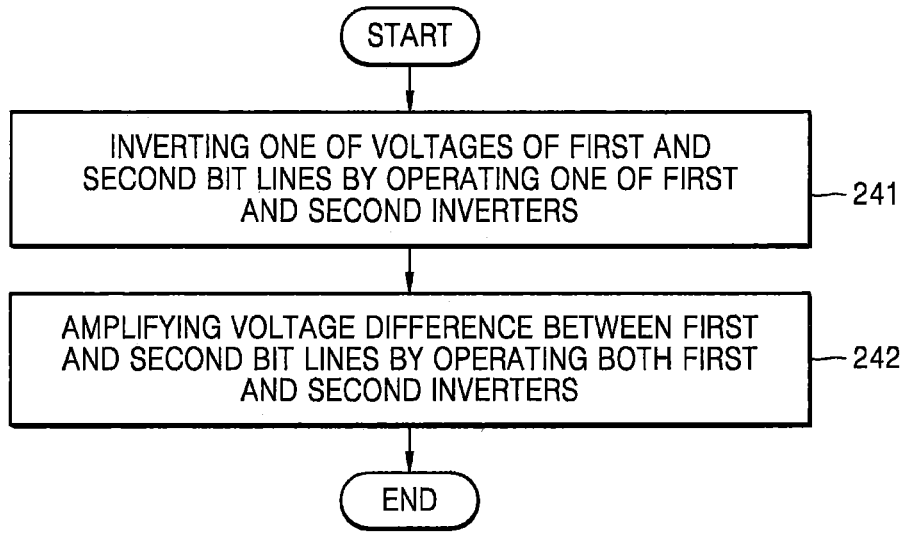

FIGS. 9 and 10 are flowcharts of a bit line sensing method according to some embodiments of the present inventive concept.

Referring to FIG. 9, a bit line sensing method according to some embodiments may include pre-charging first and second bit lines with a predetermined bit line pre-charge voltage (Block 210) and adjusting voltages of the first and second bit lines corresponding to threshold voltages of first and second inverters of a bit line sense amplifier (Block 220). The first inverter may have an input terminal that is connected to the first bit line and the second inverter may have an input terminal that is connected to the second bit line. To adjust the voltages of the first and second bit lines, output terminals of the first and second inverters may be connected to the input terminals of the first and second inverters, respectively. Accordingly, the threshold voltage of the first inverter may be set as the voltage of the first bit line, and the threshold voltage of the second inverter may be set as the voltage of the second bit line. Stated in other words, the voltage of the first bit line may be adjusted corresponding to the threshold voltage of the first inverter, and the voltage of the second bit line may be adjusted corresponding to the threshold voltage of the second inverter. As described above, an offset due to a mismatch of the first and second inverters may be compensated by adjusting the voltages of the first and second bit lines corresponding to the threshold voltages of the first and second inverters.

Thereafter, charges may be shared between one of the first and second bit lines and a corresponding memory cell (Block 230). Accordingly, there may be a voltage difference between the first and second bit lines. It will be understood that the voltage difference may be detectable. Thereafter, the first and second inverters may operate sequentially, thereby amplifying the voltage difference between the first and second bit lines in multiple operations (Block 240). In some embodiments, the voltage difference between the first and second bit lines may be amplified in two operations. Referring to FIG. 10, amplifying the voltage difference between the first and second bit lines in two operations may include operating one of the first and second inverters, thereby inverting one of the voltages of the first and second bit lines (Block 241). For example, when charges are shared between the first bit line and a memory cell, the first inverter may operate, thereby inverting and amplifying the charge-sharing voltage of the first bit line. For convenience of description, the charge-sharing operation is called a charge-sharing voltage (CSV) boosting operation.

The amplifying the voltage difference between the first and second bit lines in multiple operations may also include operating both the first and second inverters, thereby amplifying the voltage difference between the first and second bit lines (Block 242). Through the charge-sharing voltage boosting operation and the voltage difference amplification operation, the voltage difference between the first and second bit lines may be amplified in multiple operations rather than in one operation, and a sensing margin may be improved.

Figure 11:
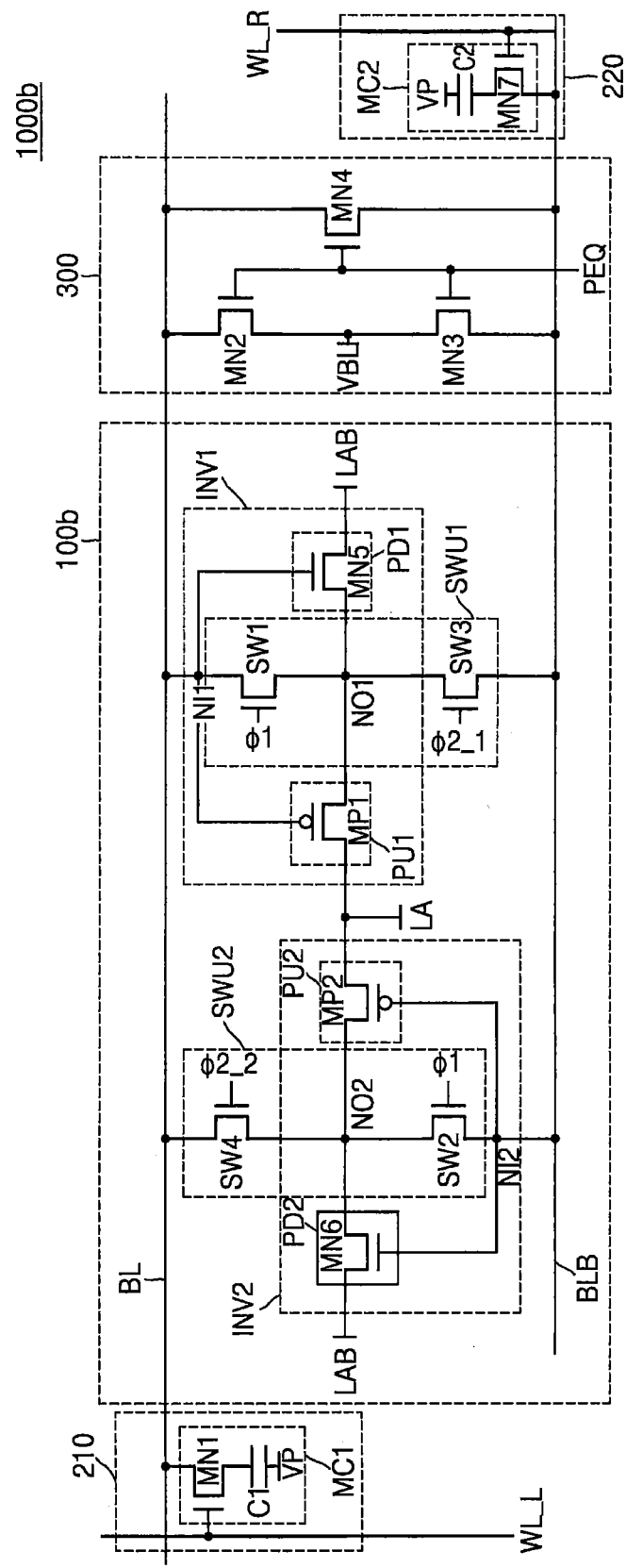
FIG. 11 is a circuit diagram illustrating a memory device including a bit line sense amplifier according to some embodiments of the present inventive concept.

FIG. 11 is a circuit diagram illustrating a memory device including a bit line sense amplifier according to some embodiments of the present inventive concept.

Referring to FIG. 11, a memory device 1000*b* may include the bit line sense amplifier 100*b*, a first memory cell array block 210, a second memory cell array block 220, and an equalizer 300. The first memory cell array block 210 may include a plurality of memory cells MCs connected to a plurality of bit lines BLs and a plurality of word lines WL_Ls. The second memory cell array block 220 may include a plurality of memory cells MCs connected to a plurality of bit lines BLBs and a plurality of word lines WL_Rs. FIG. 11 shows only one memory cell MC1 or MC2 in each of the first and second memory cell array blocks 210 and 220 for convenience of description.

The equalizer 300 may be connected between a first bit line BL and a second bit line BLB and may pre-charge the first and second bit lines BL and BLB with the pre-charge voltage VBL responsive to a pre-charge control signal PEQ.

The bit line sense amplifier 100*b* may be connected between the first bit line BL and the second bit line BLB and may amplify a difference between a voltage of the first bit line BL and a voltage of the second bit line BLB responsive to a first driving voltage and a second driving voltage. The bit line sense amplifier 100*b* may be similar to the bit line sense amplifier 100*a* illustrated in FIG. 6. However, the bit line sense amplifier 100*b* may differ from the bit line sense amplifier 100*a* of FIG. 6 with respect to operations of the third and fourth switches SW3 and SW4.

In the bit line sense amplifier 100*b*, any one of the second control signal $\Phi2\_1$ and the third control signal $\Phi2\_2$ may be enabled before the other is enabled. Therefore, in some embodiments, the second control signal $\Phi2\_1$ may be enabled before the third control signal $\Phi2\_2$ is enabled, the first inverter INV1 may thus operate before the second inverter INV2 operates. In some embodiments, the third control signal $\Phi2\_2$ may be enabled before the second control signal $\Phi2\_1$ is enabled, the second inverter INV2 may operate before the first inverter INV1 operates. Whether the second control signal $\Phi2\_1$ or the third control signal $\Phi2\_2$ is enabled first may be determined according to whether a memory cell from which data is sensed is located in the first memory cell array block 210 or in the second memory cell array block 220. For example, when it is desired to sense data of the memory cell MC1 in the first memory cell array block 210, the second control signal $\Phi2\_1$ may be enabled first, and then the third control signal $\Phi2\_2$ may be enabled. In this case, the first bit line BL may be charge-shared, and thus, the first inverter INV1 of which the input terminal NI1 is connected to the first bit line BL may operate first, thereby boosting the charge-sharing voltage. On the contrary, when it is desired to sense data of the memory cell MC2 in the second memory cell array block 220, the third control signal $\Phi2\_2$ may be enabled first, and then the second control signal $\Phi2\_1$ may be enabled. In this case, the second bit line BLB may be charge-shared, and thus, the second inverter INV2 of which the input terminal NI2 is connected to the second bit line BLB may operate first, thereby boosting the charge-sharing voltage.

Whether a memory cell to be sensed is located in the first memory cell array block 210 or in the second memory cell array block 220 may be found using information on which word line WL_L or WL_R is enabled.

Figure 12:
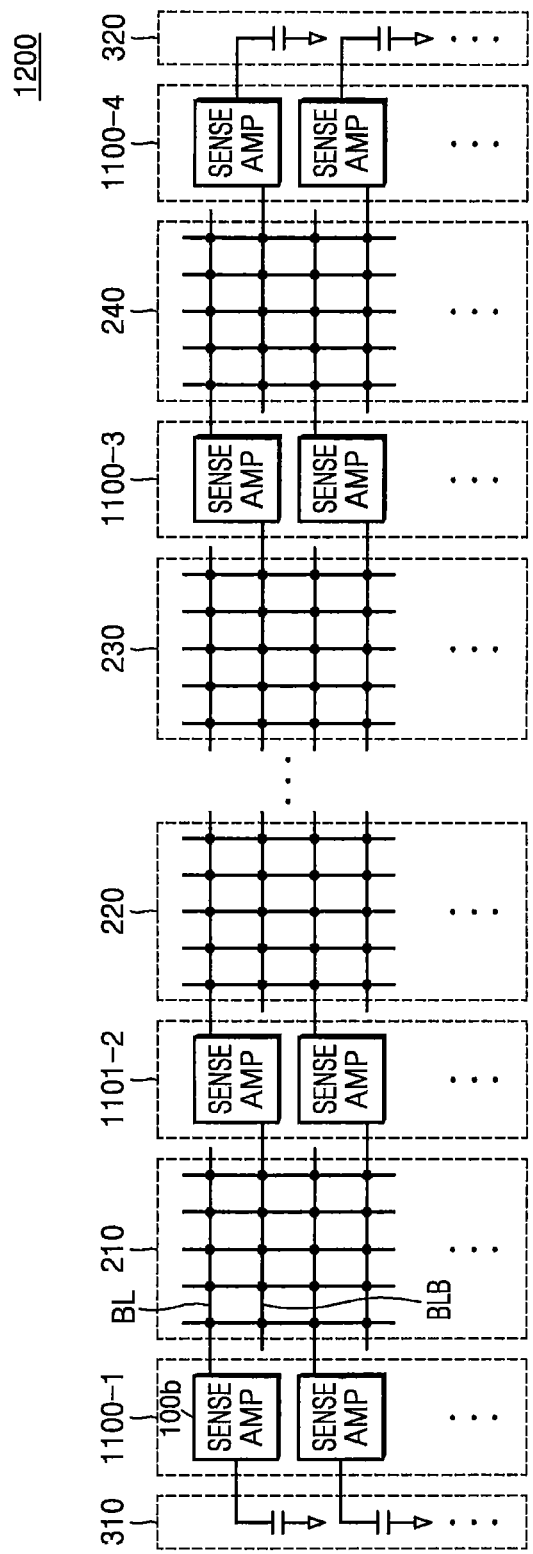
FIG. 12 is a circuit diagram illustrating a memory device according to some embodiments of the present inventive concept.

FIG. 12 is a circuit diagram illustrating a memory device according to some embodiments of the present inventive concept. In some embodiments, the memory device 1000*b* of FIG. 11 may include a plurality of bit line sense amplifiers and a plurality of memory cell array blocks as illustrated in FIG. 12. Whether the second control signal $\Phi2\_1$ or the third control signal $\Phi2\_2$ is enabled first may be determined based on whether a memory cell to be sensed is included in an odd number or an even number memory cell array block.

Referring to FIG. 12, a memory device 1200 may include a plurality of memory cell array blocks 210, 220, 230 and 240 and a plurality of sense amplifier blocks 1100-1, 1100-2, 1100-3 and 1100-4. The memory device 1200 may further include capacitor blocks 310 and 320. Each of the plurality of sense amplifier blocks 1100-1, 1100-2, 1100-3 and 1100-4 may include a plurality of bit line sense amplifiers 100*b*, and each of the plurality of memory cell array blocks 210, 220, 230 and 240 may include an array of a plurality of memory cells. Each of the capacitor blocks 310 and 320 may include a plurality of capacitors. The capacitors may reduce or possibly prevent a capacitance unbalance between a bit line BL and a complementary bit line BLB and may be referred to as balance capacitors.

Each of the bit line sense amplifiers 100*b* included in the sense amplifier blocks 1100-2, which is between the memory cell array blocks 210 and 220, and in the sense amplifier block 1100-3, which is between the memory cell array blocks 230 and 240, may be connected to one bit line of each memory cell array blocks disposed in both sides. For example, the bit line sense amplifier 100*b* in the sense amplifier blocks 1100-2 may be connected to a first bit line included in the memory cell array block 210 and a second bit line included in the memory cell array block 220. Whereas, each of the bit line sense amplifiers 100*b* included in the sense amplifier blocks 1100_1 and 1100_4 disposed in end portions of the memory device 1200 may be connected to one bit line of the memory cell array block 210 or 240 disposed in one side and may be connected to a capacitor disposed in the other side to reduce or possibly prevent a capacitance unbalance. Alternatively, each of the bit line sense amplifiers 100*b* included in the sense amplifier blocks 1100_1 and 1100_4 may be connected to a bit line including dummy cells to reduce or possibly prevent capacitance unbalance. As described above, when each one bit line is connected to the bit line sense amplifier 100*b* in both sides, one of the bit lines is a complementary bit line, i.e., a reference bit line, of the other bit line, a structure of the bit line sense amplifier 100*b* may be an open bit line sense amplifier structure.

According to whether a memory cell array block to be sensed is an odd number or even number memory cell array block, whether the second control signal $\Phi2\_1$ (refer to FIG. 11) or the third control signal $\Phi2\_2$ (refer to FIG. 11) is enabled earlier may be determined. For example, when a memory cell array block to be sensed is an odd number memory cell array block, the second control signal $\Phi2\_1$ to be applied to bit line sense amplifiers included in an odd number sense amplifier block may be enabled earlier than the third control signal $\Phi2\_2$, and the third control signal $\Phi2\_2$ to be applied to bit line sense amplifiers included in an even number sense amplifier block may be enabled earlier than the second control signal $\Phi2\_1$. When a memory cell array block to be sensed is an even number memory cell array block, an operation may be opposite to the above-described operation.

Figure 13:
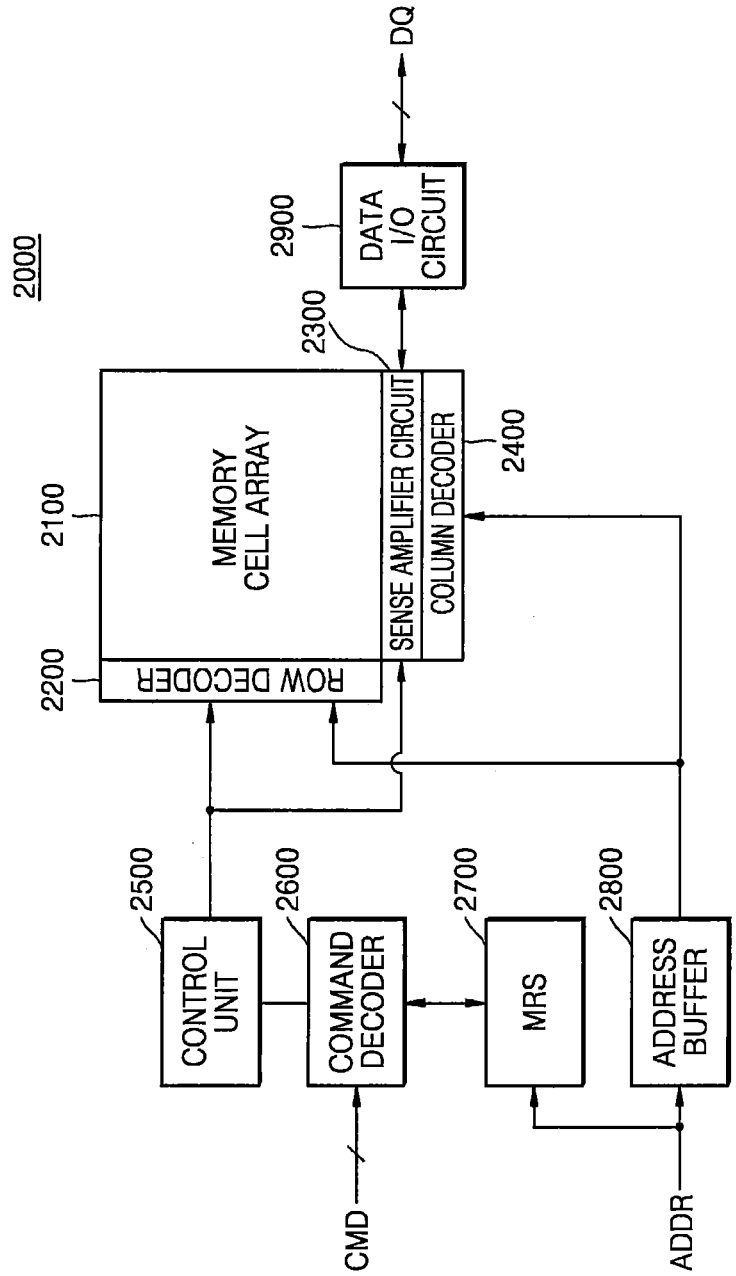
FIG. 13 is a block diagram illustrating a memory device according to some embodiments of the present inventive concept.

FIG. 13 is a block diagram illustrating a memory device according to some embodiments of the present inventive concept.

Referring to FIG. 13, a semiconductor memory device 2000 may include a memory cell array 2100, a row decoder 2200, a sense amplifier circuit 2300, a column decoder 2400, a control unit 2500, a command decoder 2600, a mode register set (MRS) circuit 2700, an address buffer 2800, and a data input/output circuit 2900.

The memory cell array 2100 may be a data storage in which a number of memory cells are arranged, for example, in a matrix form. The memory cell may be a DRAM memory cell.

The sense amplifier circuit 2300 may include the bit line sense amplifiers according to some embodiments of the present inventive concept and may further include a local sense amplifier and an input/output sense amplifier.

Data DQ input through the data input/output circuit 2900 may be written in the memory cell array 2100 responsive to an address signal ADDR, and data DQ read from the memory cell array 2100 responsive to the address signal ADDR may be output to the outside through the data input/output circuit 2900. To designate a memory cell in or from which the data DQ is written or read, the address signal ADDR may be input to the address buffer 2800. The address buffer 2800 may temporarily store the address signal ADDR input from the outside.

The row decoder 2200 may decode a row address in the address signal ADDR output from the address buffer 2800 to designate a word line connected to the memory cell in or from which the data DQ is input or output. That is, the row decoder 2200 may enable a corresponding word line by decoding the row address output from the address buffer 2800 in a data write or read mode.

The column decoder 2400 may decode a column address in the address signal ADDR output from the address buffer 2800 to designate a bit line connected to the memory cell in or from which the data DQ is input or output.

The command decoder 2600 may receive a command signal CMD (e.g., /CBR and /CKE) and the like applied from the outside and may internally generate a decoded command signal by decoding the signals. The MRS circuit 2700 may set an internal mode register responsive to an MRS command for designating an operation mode of the semiconductor memory device 2000 and to the address signal ADDR. The control unit 2500 may control an operation of the semiconductor memory device 2000 responsive to a command output from the command decoder 2600.

Although not shown in FIG. 13, the semiconductor memory device 2000 may further include a clock circuit for generating a clock signal, and a power source circuit for receiving a power source voltage applied from the outside and generating or distributing internal voltages.

Figure 14:
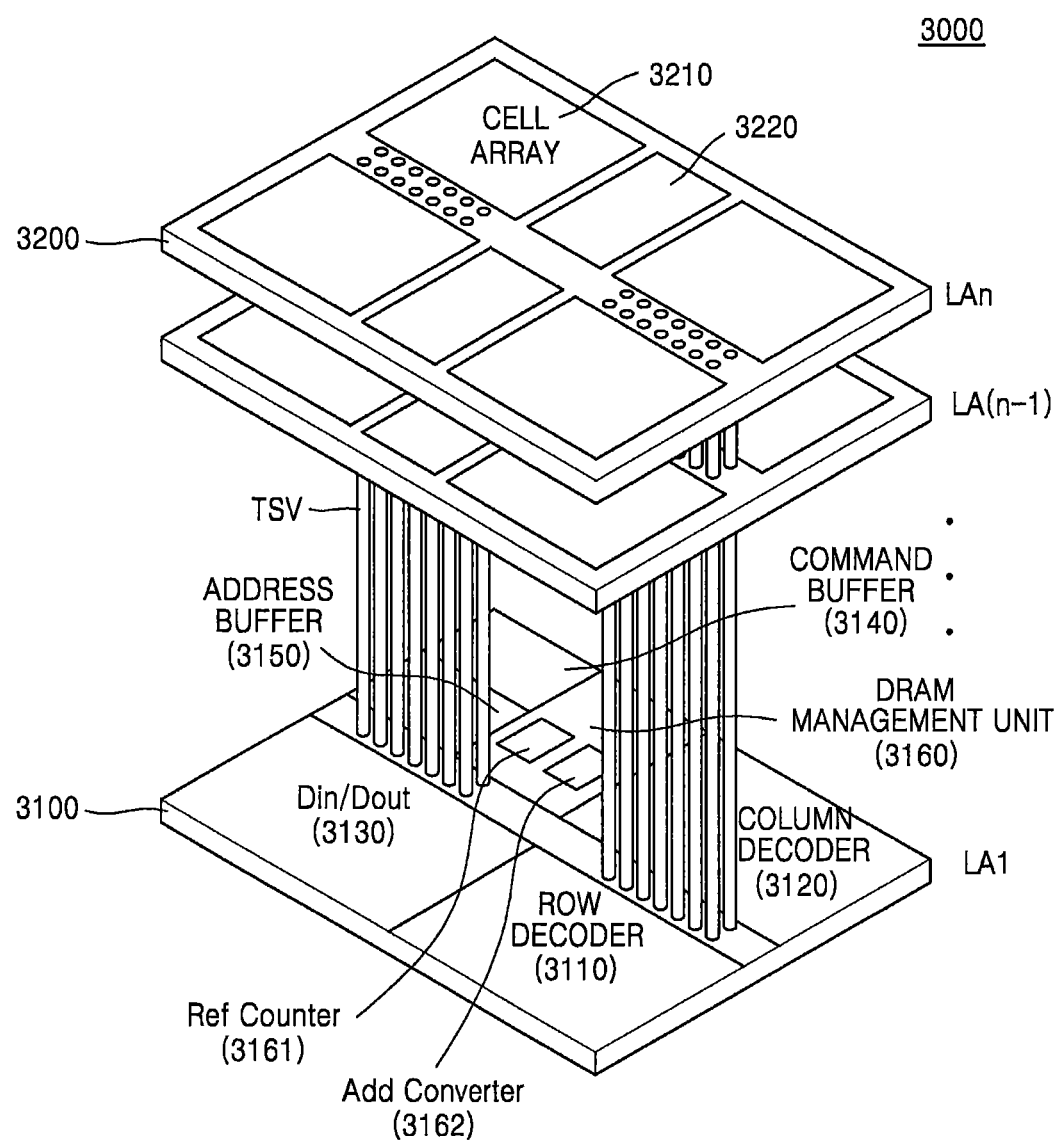
FIG. 14 is a diagram illustrating a memory device according to some embodiments of the present inventive concept.

FIG. 14 is a diagram illustrating a memory device according to some embodiments of the present inventive concept.

Referring to FIG. 14, a semiconductor memory device 3000 may include first to nth semiconductor layers LA1 (3100) to LAn (3200). Each of the first to nth semiconductor layers LA1 to LAn may be a memory chip including, for example, a DRAM cell. Some of the first to nth semiconductor layers LA1 to LAn may be master chips for interfacing with an external controller, and some of the first to nth semiconductor layers LA1 to LAn may be slave chips for storing data. For example, the first semiconductor layer LA1 located at the bottom may be a master chip, and the second semiconductor layers LA2 to LAn may be slave chips.

The first to nth semiconductor layers LA1 to LAn may transmit and receive a signal to and/or from each other through a through silicon via (TSV), and the master chip LA1 may communicate with an external memory controller through a conductive unit on an outer surface of the master chip LA1. A configuration and operation of the semiconductor memory device 3000 will now be described assuming that the first semiconductor layer 3100 is a master chip and the nth semiconductor layer 3200 is a slave chip.

The first semiconductor layer 3100 may include various kinds of circuits for driving a cell array 3210 included in slave chips. For example, the first semiconductor layer 3100 may include a row decoder (X-Dec) 3110 for driving a word line of the cell array 3210, a column decoder (Y-Dec) 3120 for driving a bit line of the cell array 3210, a data input/output unit 3130 for controlling an input/output of data, a command buffer 3140 for receiving a command from the outside, an address buffer 3150 for receiving an address from the outside and buffering the received address.

The first semiconductor layer 3100 may further include a DRAM management unit 3160 for managing a memory operation of a slave chip. The DRAM management unit 3160 may include a reference counter 3161 and an address converter 3162. The nth semiconductor layer 3200 may include the cell array 3210 and a peripheral circuit region 3220 including other peripheral circuits for driving the cell array 3210. For example, a row/column selection unit for selecting a row and a column of the cell array 3210, a bit line sense amplifier, and the like may be disposed in the peripheral circuit region 3220. The bit line sense amplifier may be a bit line sense amplifier according some embodiments of the present inventive concept. Therefore, an offset between inverters of the bit line sense amplifier may be compensated, thereby increasing a sensing sensitivity of the bit line sense amplifier.

Figure 15:
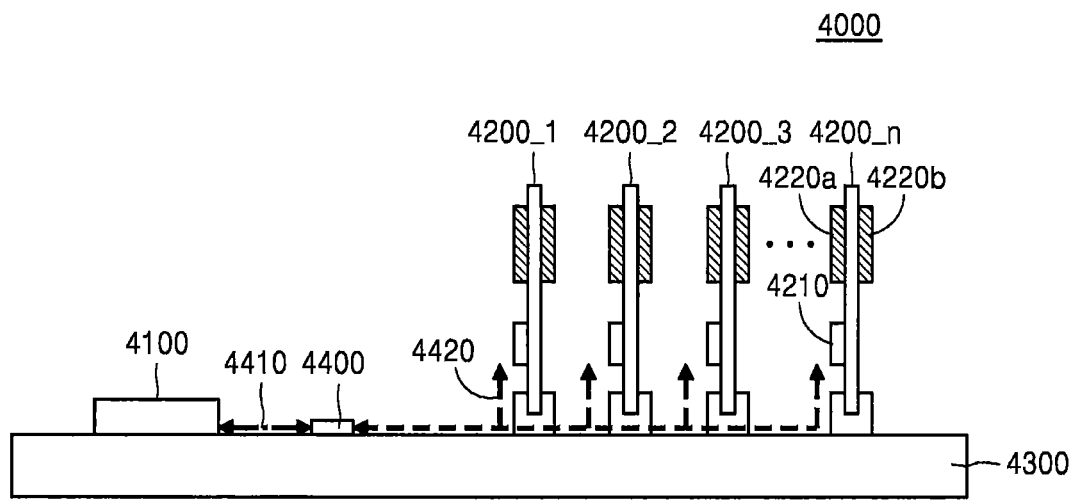
FIG. 15 is a diagram illustrating a server system according to some embodiments of the present inventive concept.

FIG. 15 is a diagram illustrating a server system according to some embodiments of the present inventive concept.

Referring to FIG. 15, a server system 4000 may include a memory controller 4100 and first to nth memory modules 4200_1 to 4200_n. Each of the first to nth memory modules 4200_1 to 4200_n may include memory blocks 4220a and 4220b each including a plurality of memory chips. For example, the memory chips included in the memory blocks 4220a and 4220b may be DRAM chips.

The first to nth memory modules 4200_1 to 4200_n may include a bit line sense amplifiers 100, 100a, and 100b according to some embodiments of the present inventive concept or a memory device according to some embodiments of the present inventive concept. Therefore, an offset between inverters of the bit line sense amplifier may be compensated, thereby increasing a sensing efficiency of the bit line sense amplifier.

The server system 4000 may have a single-channel structure in which the memory controller 4100 and the first to nth memory modules 4200_1 to 4200_n are mounted on a same circuit board 4300. However, embodiments of the present inventive concept are not limited thereto. In some embodiments, the server system 4000 may have various structures, such as a multi-channel structure in which sub-boards on which a plurality of memory modules are mounted are coupled to respective sockets of a main board on which the memory controller 4100 is mounted.

Signals of the first to nth memory modules 4200_1 to 4200_n may be delivered by an optical I/O connection. The server system 4000 may further include an electro-optic conversion unit 4400, and each of the first to nth memory modules 4200_1 to 4200_n may further include a photoelectric conversion unit 4210. Some embodiments of the present inventive concept, the electro-optic conversion unit 4400 may be embedded in the memory controller 4100.

The memory controller 4100 may be connected to the electro-optic conversion unit 4400 through an electrical channel 4410. Accordingly, the memory controller 4100 may exchange signals with the electro-optic conversion unit 4400 through the electrical channel 4410.

The electro-optic conversion unit 4400 may process signals such that the electro-optic conversion unit 4400 may convert an electrical signal received from the memory controller 4100 into an optical signal and may deliver the converted optical signal through an optical channel 4420, and converts an optical signal received through the optical channel 4420 into an electrical signal and delivers the converted electrical signal through the electrical channel 4410.

The first to nth memory modules 4200_1 to 4200_n may be connected to the electro-optic conversion unit 4400 through the optical channel 4420. An optical signal transmitted through the optical channel 4420 may be input to the photoelectric conversion unit 4210 included in the first to nth memory modules 4200_1 to 4200_n. The photoelectric conversion unit 4210 may convert the optical signal into an electrical signal and may deliver the converted electrical signal to each of the memory blocks 4220a and 4220b. An electrical signal generated by each of the memory blocks 4220a and 4220b may be converted into an optical signal by the photoelectric conversion unit 4210.

In the server system 4000, signals between the memory controller 4100 and the first to nth memory modules 4200_1 to 4200_n may be transmitted through the optical channel 4420 by using an optical input/output method.

Figure 16:
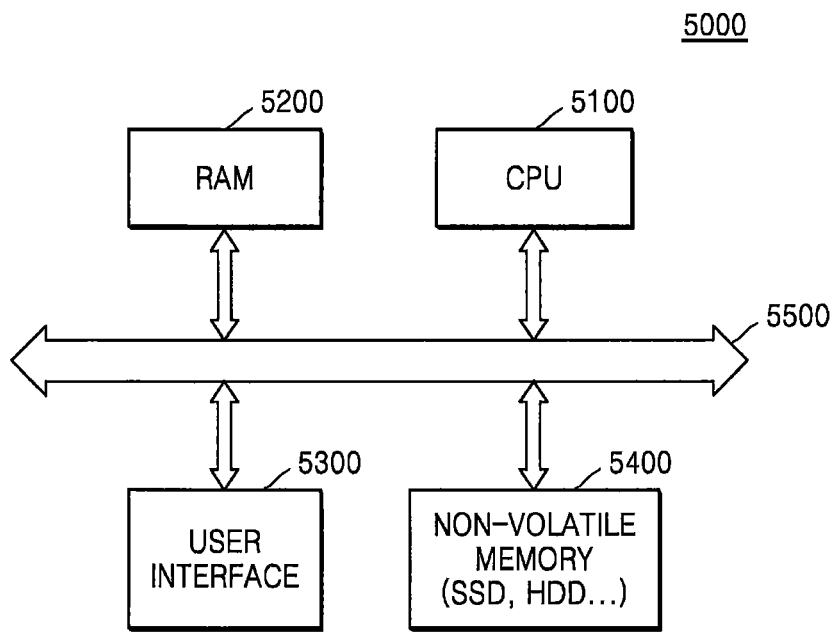
FIG. 16 is a block diagram illustrating a computing system according to some embodiments of the present inventive concept.

FIG. 16 is a block diagram illustrating a computing system according to some embodiments of the present inventive concept. Referring to FIG. 16, a computing system 5000 may include a semiconductor memory device according to some embodiments of the present inventive concept. The semiconductor memory device according to some embodiments of the present inventive concept may be a RAM 5200 that is mounted in an information processing system, such as a mobile device or a desk-top computer. The RAM 5200 may be a semiconductor memory device or a memory module. The RAM 5200 may be an assembly of a semiconductor memory device and a memory controller.

The computing system 5000 may include a central processing unit (CPU) 5100, the RAM 5200, a user interface 5300, and a nonvolatile memory 5400 which are electrically connected to a bus 5500. For the nonvolatile memory 5400, a large-capacity storage device, such as a solid state drive (SSD) or a hard disk drive (HDD), may be used.

In the computing system 5000, the RAM 5200 may include DRAM chips including DRAM cells for storing data, and each of the DRAM chips may include a bit line sense amplifier according to some embodiments of the present inventive concept. Accordingly, a sensing efficiency of data stored in the DRAM chips may increase.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A bit line sensing method, the method comprising:
   pre-charging a first bit line and a second bit line with a bit line pre-charge voltage, wherein the first bit line is connected to a first input terminal of a first inverter, and the second bit line is connected to a second input terminal of a second inverter;
   adjusting voltages of the first bit line and the second bit line corresponding to either threshold voltages of first and second pull-down circuits included in the first and second inverters respectively or threshold voltages of first and second pull-up circuits included in the first and second inverters respectively;
   sharing charges of one of the first bit line and the second bit line with charges of a corresponding memory cell; and
   amplifying a voltage difference between the first bit line and the second bit line.

2. The bit line sensing method of claim 1, wherein the adjusting the voltages of the first bit line and the second bit line comprises:
   connecting a first output terminal of the first inverter to the first input terminal and a second output terminal of the second inverter to the second input terminal; and
   selectively operating either the first and second pull-down circuits or the first and second pull-up circuits.

3. The bit line sensing method of claim 2, wherein:
   each of the first and second pull-down circuits comprises an N-channel metal oxide semiconductor (NMOS) transistor; and
   each of the first and second pull-up circuits comprises a P-channel metal oxide semiconductor (PMOS) transistor.

4. The bit line sensing method of claim 3, wherein the selectively operating either the first and second pull-down circuits or the first and second pull-up circuits comprises operating the first and second pull-down circuits when the NMOS transistor has a size that is substantially the same as a size of the PMOS transistor.

5. The bit line sensing method of claim 2, wherein the selectively operating either the first and second pull-down circuits or the first and second pull-up circuits comprises applying a driving voltage to either the first and second pull-down circuits or the first and second pull-up circuits.

6. The bit line sensing method of claim 1, wherein:
   the adjusting the voltages of the first bit line and the second bit line comprises turning on a first switch that is connected between the first input terminal and a first output terminal of the first inverter and a second switch that is connected between the second input terminal and a second output terminal of the second inverter responsive to a first control signal; and
   the sharing the charges of the one of the first bit line and the second bit line with the charges of the corresponding memory cell and the amplifying the voltage difference between the first bit line and the second bit line comprise turning off the first and second switches.

7. The bit line sensing method of claim 6, wherein the sharing the charges of the one of the first bit line and the second bit line with the charges of the corresponding memory cell and the amplifying the voltage difference between the first bit line and the second bit line comprise turning on a third switch that is connected between the first output terminal and the second bit line and a fourth switch that is connected between the second output terminal and the first bit line.

8. The bit line sensing method of claim 7, wherein the first and second switches operate exclusively with respect to the third and fourth switches.

9. The bit line sensing method of claim 7, wherein:
the sharing the charges of the one of the first bit line and the second bit line with the charges of the corresponding memory cell comprises turning on the third switch responsive to a second control signal changing from a first state to a second state at a first time, wherein the second state is different from the first state; and
the amplifying the voltage difference between the first bit line and the second bit line comprises turning on the fourth switch responsive to a third control signal changing from the first state to the second state at a second time that is different from the first time.

10. A bit line sensing method, the method comprising:
pre-charging a first bit line and a second bit line with a bit line pre-charge voltage, wherein the first bit line and the second bit line are connected to a first inverter and a second inverter, which are reversely connected between the first bit line and the second bit line;
adjusting one of voltages of the first and second bit lines corresponding to one of threshold voltages of the first and second inverters;
sharing charges of one of the first and second bit lines with charges of a corresponding memory cell; and
amplifying a voltage difference between the first bit line and the second bit line, wherein one of the voltages of the first and second bit lines is amplified in multiple operations.

11. The bit line sensing method of claim 10, wherein the amplifying the voltage difference between the first bit line and the second bit line comprises:
inverting the voltage of one of the first and second bit lines by operating one of the first and second inverters; and
amplifying the voltage difference between the first and second bit lines by operating the first and second inverters.

12. The bit line sensing method of claim 11, wherein the inverting the voltage of the one of the first and second bit lines comprises:
inverting the voltage of the first bit line by operating the first inverter when the charges of the first bit line are shared with the charges of the corresponding memory cell; and
inverting the voltage of the second bit line by operating the second inverter when the charges of the second bit line are shared with the charges of the corresponding memory cell.

13. The bit line sensing method of claim 10, wherein the amplifying the voltage difference between the first bit line and the second bit line comprises:
turning on a first output switch that is connected between a first output terminal of the first inverter and the second bit line responsive to a first output control signal changing from a first state to a second state that is different from the first state before applying driving voltages to the first and second inverters; and
turning on a second output switch that is connected between a second output terminal of the second inverter and the first bit line responsive to a second output control signal changing from the first state to the second state after applying the driving voltages to the first and second inverters.

14. The bit line sensing method of claim 10, wherein the adjusting the one of the voltages of the first and second bit lines comprises:
connecting a first input terminal of the first inverter to a first output terminal of the first inverter by turning on a first input switch that is connected between the first input terminal and the first output terminal and a second input terminal of the second inverter to a second output terminal of the second inverter by turning on a second input switch that is connected between the second input terminal and the second output terminal responsive to an offset control signal; and
applying a driving voltage to the first and second inverters after the connecting the first input terminal to the first output terminal and the second input terminal to the second output terminal.

15. The bit line sensing method of claim 10, wherein the corresponding memory cell is a dynamic random access memory (DRAM) cell.

16. A bit line sensing method, the method comprising:
charging a first bit line and a second bit line with a pre-charge voltage, wherein the first bit line is connected to a first input terminal of a first inverter, and the second bit line is connected to a second input terminal of a second inverter;
connecting a first output terminal of the first inverter to the first input terminal and a second output terminal of the second inverter to the second input terminal;
operating either first and second pull-up circuits of the first and second inverters respectively or first and second pull-down circuits of the first and second inverters respectively;
connecting the first output terminal to the second bit line at a first time;
connecting the second output terminal to the first bit line at a second time;
sharing charges of one of the first bit line and the second bit line with charges of a memory cell at third time; and
applying a first driving voltage to the first inverter and a second driving voltage to the second inverter at a fourth time.

17. The method of claim 16, wherein the operating either the first and second pull-up circuits of the first and second inverters respectively or the first and second pull-down circuits of the first and second inverters respectively comprises operating the first and second pull-up circuits exclusively with respect to the first and second pull-down circuits.

18. The method of claim 16, wherein the second time is after the first time.

19. The method of claim 18, wherein the fourth time is between the first time and the second time.

20. The method of claim 16, wherein:
the first time is substantially equal to the second time; and
the fourth time is after the third time.

* * * * *